(12) United States Patent
McFarland

(10) Patent No.: US 6,898,563 B1
(45) Date of Patent: May 24, 2005

(54) SYSTEM FOR AIDING IN THE DESIGN OF COMBINATORIAL LOGIC AND SEQUENTIAL STATE MACHINES

(76) Inventor: M. David McFarland, 3706 Old Stilesboro Rd., Kennesaw, GA (US) 30152

( * ) Notice: Subject to any disclaimer, the term of this patent is extended or adjusted under 35 U.S.C. 154(b) by 1058 days.

(21) Appl. No.: 09/742,774

(22) Filed: Dec. 20, 2000

Related U.S. Application Data

(60) Provisional application No. 60/172,829, filed on Dec. 20, 1999.

(51) Int. Cl.$^7$ ............................................. G06F 17/50
(52) U.S. Cl. ........................... 703/15; 714/50; 714/724; 714/737
(58) Field of Search .............................. 703/15; 714/50, 714/724

(56) References Cited

U.S. PATENT DOCUMENTS

| | | |
|---|---|---|
| 4,475,156 A | 10/1984 | Federico et al. |
| 4,892,370 A | 1/1990 | Lee |
| 5,301,284 A | 4/1994 | Estes et al. |
| 5,748,497 A * | 5/1998 | Scott et al. ................. 702/181 |

* cited by examiner

*Primary Examiner*—Leo Picard
*Assistant Examiner*—Carlos R. Ortiz Rodriguez

(74) *Attorney, Agent, or Firm*—Troutman Sanders LLP; Ryan A. Schneider

(57) ABSTRACT

A computer software tool for aiding in the design of combinatorial logic and sequential state machines comprising, according to the preferred embodiment, an apparatus and methods for representing and displaying a mathematical transform between a binary output variable and a set of binary input variables. The apparatus includes a computer software program which performs a method having the steps of separating input variables of a transform into successive fields, providing field combination maps having cells representative of binary combinations of field variables, assigning field combination maps of successive fields to each preceding field cell, and assigning binary values to field cell chains formed thereby. The computer software program also enables the visual display, on the display of a computer monitor, of the combination maps and the relationship between combination maps of preceding and successive fields. The process of visually displaying the combination maps includes a step of collapsing selected fields and maps associated therewith to reduce clutter on the display and to enable the use of transforms having a large number of input variables without becoming unwieldy. The collapsing of selected fields and maps on the display also enables the selected display of only combinations of those input variables that effect the value of selected outputs. The display of combination maps and the collapsing of selected maps, in addition, more easily enables a user to insure that all input variable combinations have been considered and that only one transform value has been assigned to each of the combinations.

48 Claims, 16 Drawing Sheets

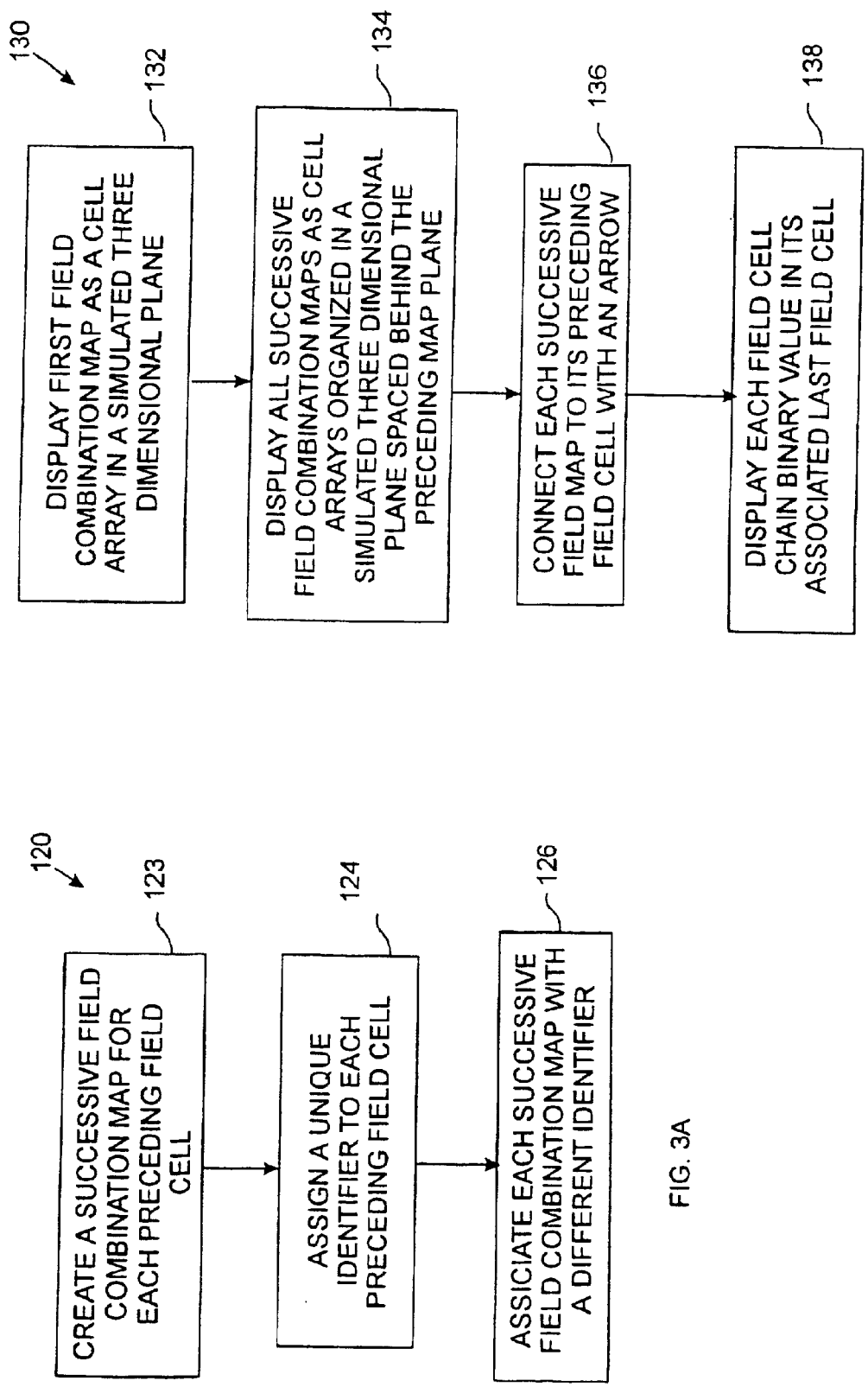

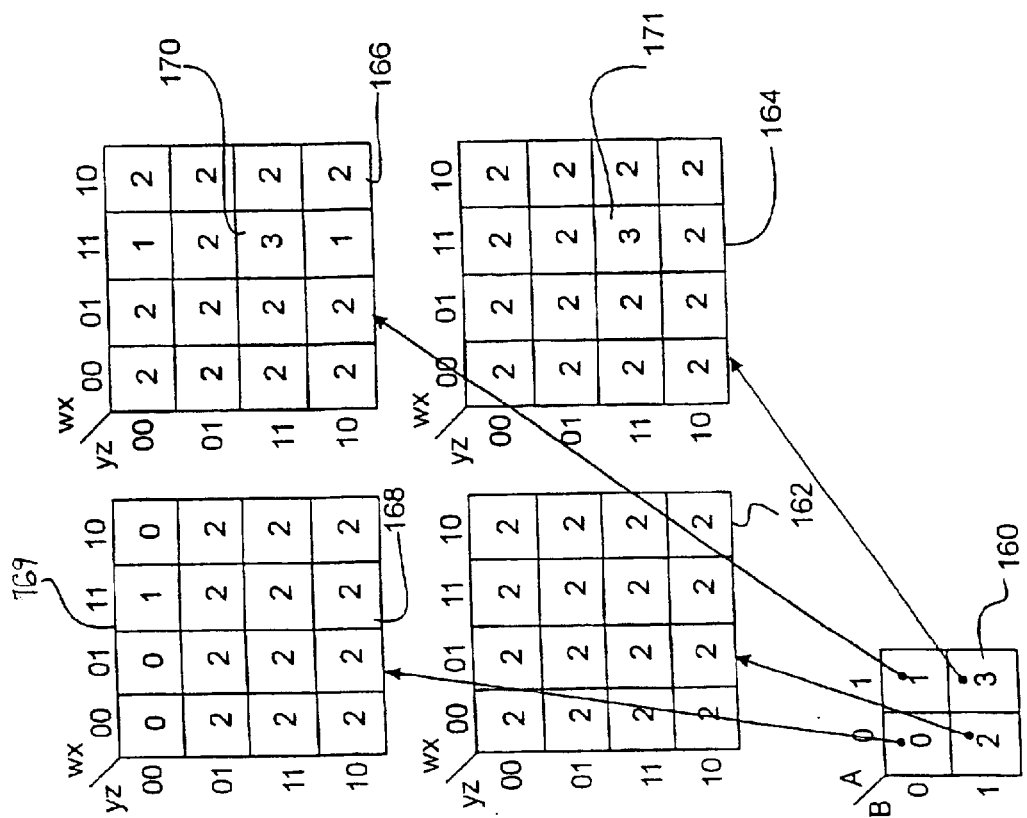
FIG. 4B
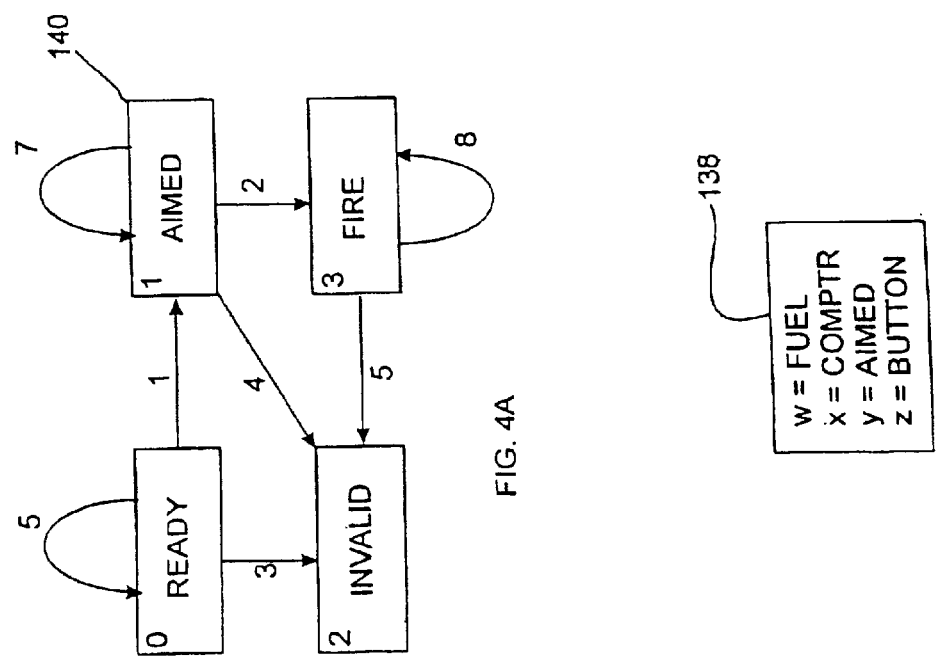
FIG. 4A
FIG. 4C

A+ = f(A,B,w,x,y,z)

A+ = A'B'wxy'z' + AB'(wxz' + wxyz) + ABwxyz

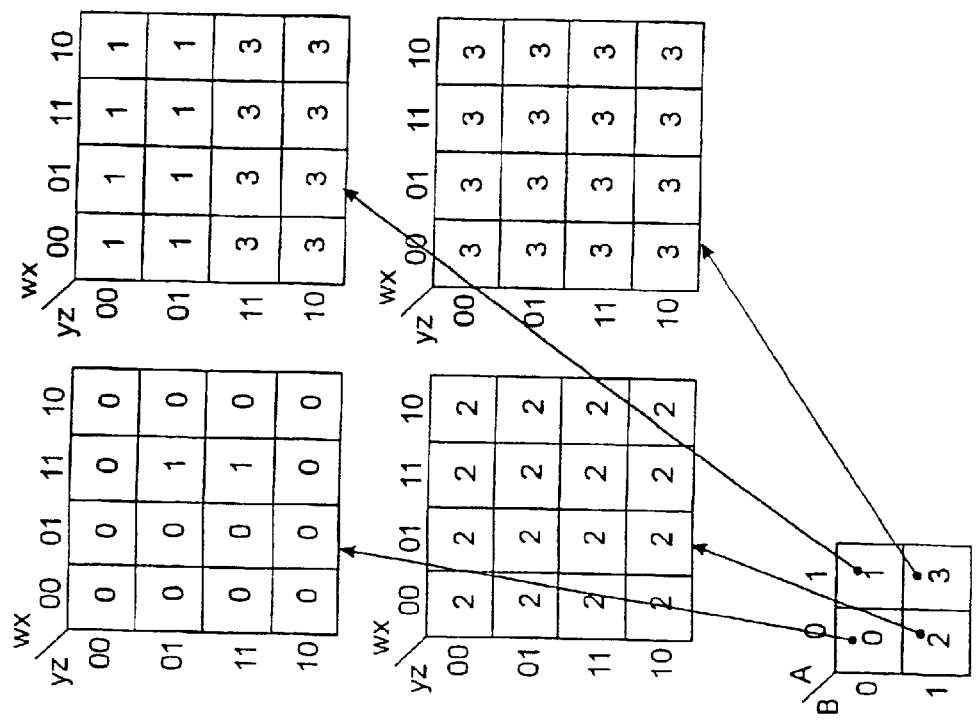
FIG. 8B
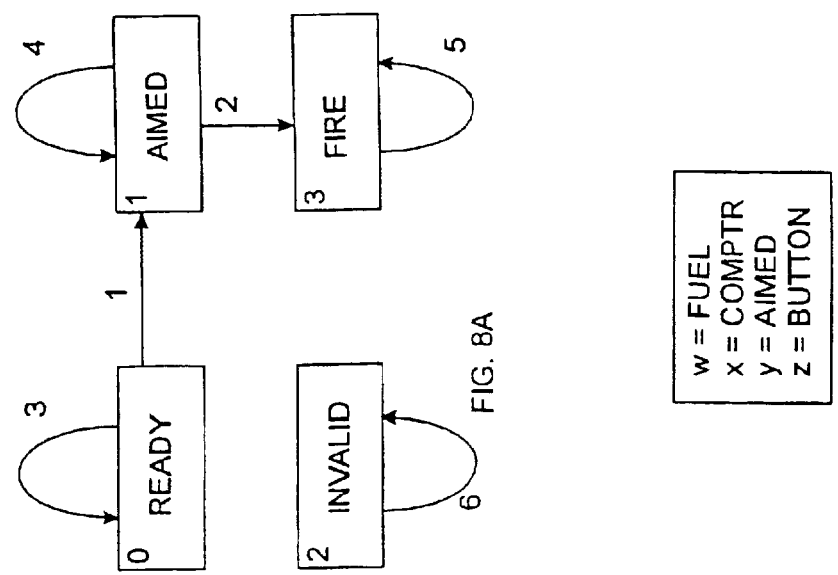
FIG. 8A
FIG.8C

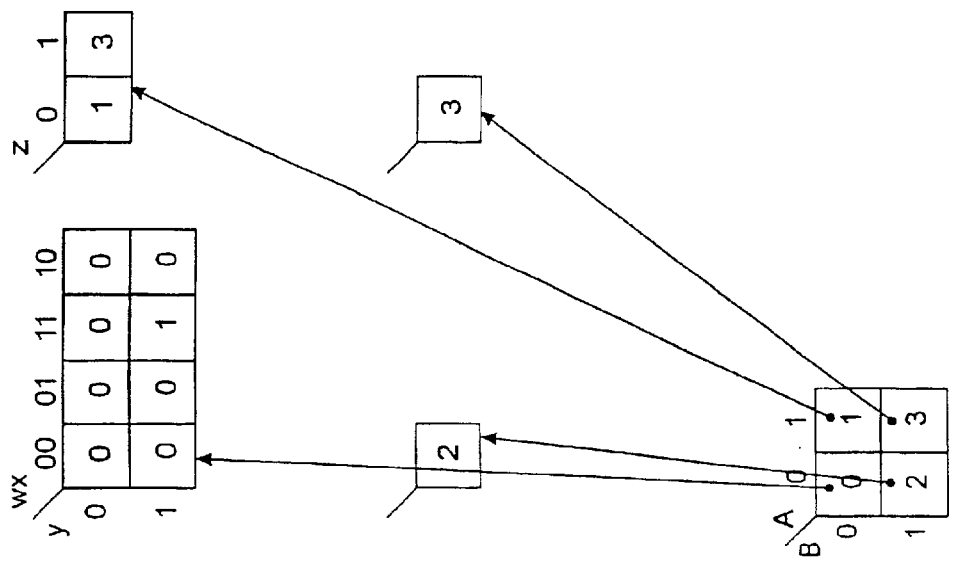
FIG. 9B
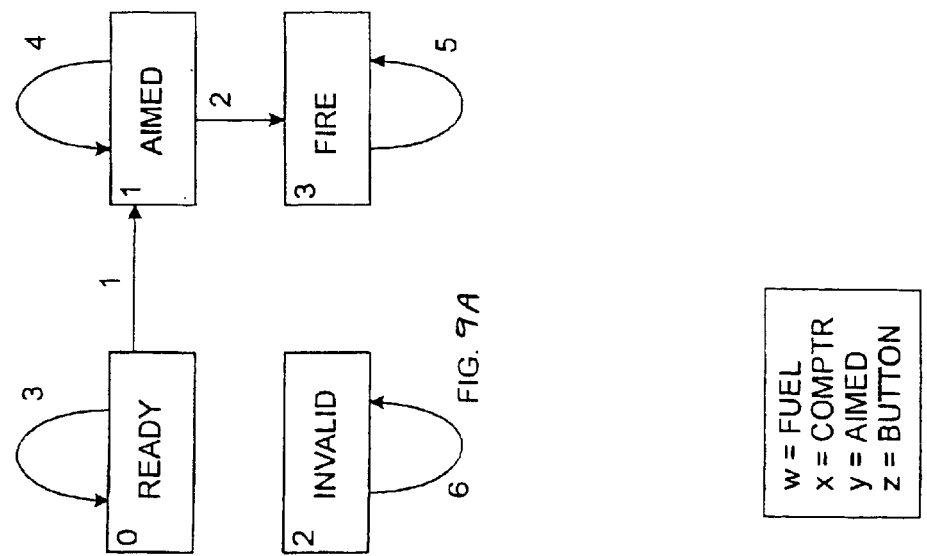
FIG. 9A
w = FUEL
x = COMPTR
y = AIMED
z = BUTTON
FIG. 9C

| | |
|---|---|
| 400 | 2 = 2#0000_0000_0000_0010# | NUMBER OF EQUATIONS |
| 401 | 17 = 2# 0000_0000_0001_0001# | LOCATION OF END OF ARRAY |
| 402 | 16384 = 2#1000_0000_0000_0000# | BIT LOCATION OF EQUATION 1. EQUATION WILL BE SET |
| 403 | 2 = 2#0000_0000_0000_0010# | NUMBER OF MINTERMS OF EQUATION 1 |
| 404 | 3 = 2#0000_0000_0000_0011# | NUMBER OF VARIABLES IN MINTERM 1 OF EQUATION 1 |
| 405 | 16384 = 2#1000_0000_0000_0000# | FIRST VARIABLE IDENTIFIER OF MINTERM 1 OF EQUATION 1, NOTED |
| 406 | 1 = 2#0000_0000_0000_0001# | SECOND VARIABLE IDENTIFIER OF MINTERM 1 OF EQUATION 1 |
| 407 | 16386 = 2#1000_0000_0000_0010# | THIRD VARIABLE IDENTIFIER OF MINTERM 1 OF EQUATION 1 |
| 408 | 3 = 2#0000_0000_0000_0011# | NUMBER OF VARIABLES IN MINTERM 2 OF EQUATION 1, NOTED |
| 409 | 1 = 2#0000_0000_0000_0001# | NUMBER OF VARIABLES IN MINTERM 2 OF EQUATION 1 |
| 410 | 1 = 2#0000_0000_0000_00001# | FIRST VARIABLE IDENTIFIER OF MINTERM 2 OF EQUATION 1 |
| 411 | 1 = 2#0000_0000_0000_0001# | NUMBER OF VARIABLES IN MINTERM 2 OF EQUATION 1 |
| 412 | 3 = 2#0000_0000_0000_0010# | BIT LOCATION OF EQUATION 2, WILL BE RESET |
| 413 | 1 = 2#0000_0000_0000_0001# | NUMBER OF VARIABLES IN MINTERM 1 OF EQUATION 2 |
| 414 | 1 = 2#0000_0000_0000_0001# | FIRST VARIABLE IDENTIFIER OF MINTERM 1 OF EQUATION 2 |
| 415 | 1= 2#0000_0000_0000_0001# | NUMBER OF VARIABLES IN MINTERM 1 OF EQUATION 2 |
| 416 | 0 = 2#0000_0000_0000_0000# | END OF ARRAY |

417 — BIT0 (TO BE SET) := NOT VARIABLE_0 AND VARIABLE_1 AND NOT VARIABLE_2 OR NOT VARIABLE_1
418 — BIT3 (TO BE RESET) := NOT VARIABLE_1

FIG. 11

SYSTEM FOR AIDING IN THE DESIGN OF COMBINATORIAL LOGIC AND SEQUENTIAL STATE MACHINES

CROSS REFERENCE TO RELATED APPLICATION

This application claims priority, under 35 U.S.C. § 119(e), on U.S. provisional patent application Ser. No. 60/172,829 which was filed Dec. 20, 1999.

FIELD OF THE INVENTION

The present invention relates, generally, to the field of tools for aiding in the design of combinatorial logic and sequential state machines and, in its preferred embodiments, to the field of computer software and methods for representing and displaying a transform between a binary variable and a set of binary input variables.

BACKGROUND OF THE INVENTION

Modern digital logic design and analysis often requires the design of combinatorial logic and sequential state machines. The design and analysis process, typically, includes a step of expressing or modeling binary output variables as mathematical transforms or functions of input binary variables. For instance, binary output variables representative of circuit outputs or flip-flop next states may be modeled as mathematical transforms, or functions, of input binary variables such as circuit inputs or flip-flop present states, respectively. Techniques for representing such transforms include truth tables, Karnaugh maps, Quine-MeCluskey method and variable entered maps (i.e., which are illustrated, for example, in *Digital Logic and Computer Design*, by Thomas McCalla, Macmillan Publishing, 1992). Unfortunately, these representation techniques are found to be suitable, generally, only when the number of input variables is small (e.g., six or less) because the number of tables or maps becomes unwieldy with a large number of input variables, thereby increasing the possibility for errors.

The design and analysis process of combinatorial logic and sequential state machines also, typically, includes a step of confirming that all possible relevant combinations of input variables have been appropriately addressed by the modeling step. Generally, to provide such confirmation, a designer must manually determine, among other things, whether each output variable has been modeled using all appropriate input variables (i.e., some input variables may not effect a particular output variable) and whether a particular combination of input variables has been erroneously duplicated during the modeling step.

Therefore, there exists in the industry, a need for a system for aiding a logic designer in the representation of combinatorial logic and sequential state machines, for assisting the designer in confirming that output variables have been appropriately and non-erroneously included in the modeling process, and for addressing these and other related, and unrelated, problems.

SUMMARY OF THE INVENTION

Briefly described, the present invention comprises a system for representing and displaying a mathematical transform between a binary output variable and a set of binary input variables. In accordance with a preferred embodiment of the present invention, the system includes a computer software application which implements a method of the present invention on a digital computer apparatus. The method first includes the separation of a transform's input variables into successive fields. For each such field, a field combination map having cells is produced, wherein each cell represents a binary combination of that field's variables. Preferably, the field combination maps are Karnaugh maps. A different field combination map of a successive field is then, preferably, assigned to each preceding field cell, thereby linking each last field cell with one cell of each preceding field to form a field cell chain associated with that last field cell. Binary values are then, preferably, assigned to all field cell chains in accordance with the transform.

The method also, preferably, comprises a step of visually displaying the combination maps and the relationship between combination maps of preceding and successive fields on a computer monitor. The step of visually displaying the combination maps, preferably, includes a step of collapsing selected fields and the maps associated therewith (i.e., selected by a user) on the display of the computer monitor, thereby reducing clutter on the display of the computer monitor and enabling the use of transforms having a large number of input variables without becoming unwieldy. The collapsing of selected fields and maps on the display enables the selected display of only combinations of those input variables that effect the value of selected outputs. The display of combination maps and the collapsing of selected maps also more easily enables a user to insure that all input variable combinations have been considered and that only one transform value has been assigned to each of the combinations. Overall, such display, facilitates the design and analysis of combinational logic circuits and sequential state machines and enhances a designer's understanding and control of logic transforms.

The method further, preferably, comprises steps of encoding the transform in a linear array and storing the encoded transform in successive storage locations. Such encoding minimizes the storage capacity required to store the transform, thereby enabling the method to be employed on a computer, or similar device, having limited storage capacity. Additionally, the method, preferably, comprises a step of restricting output changes to adjacent values where only one output bit changes for each change in an input combination. By so restricting output changes, a logic device implementing the transform will operate faster.

Accordingly, it is an object of the present invention to represent and display a mathematical transform between a binary output variable and a set of binary input variables.

Another object of the present invention is to enable the representation and display of a mathematical transform between a binary output variable and a large number of binary input variables.

Still another object of the present invention is to represent a mathematical transform as a plurality of combinational maps.

Still another object of the present invention is to enable the display of selected combinational maps in a collapsed form.

Still another object of the present invention is to reduce display clutter when displaying a mathematical transform between a binary output variable and a large number of binary input variables.

Still another object of the present invention is to facilitate the detection of output variables for which no relationship to input variables has been defined.

Still another object of the present invention is to facilitate the detection of ambiguous or incomplete output variable specifications.

Still another object of the present invention is to reduce the amount of storage capacity required for the storage of a transform between a binary output variable and a set of binary input variables.

Other objects, features, and advantages of the present invention will become apparent upon reading and understanding the present specification when taken in conjunction with the appended drawings.

BRIEF DESCRIPTION OF THE DRAWINGS

FIG. 3A is a flowchart representation of a method for performing the step of assigning a different successive field combination map to each preceding field cell, as displayed in the flowchart of FIG. 2.

FIG. 3B is a flowchart representation adding graphical display steps to the method represented by the flowchart of FIG. 2.

FIG. 4A is an exemplary sequential state diagram.

FIG. 4B is an exemplary next state map for the state diagram of FIG. 4A.

FIG. 4C is an exemplary table of input variables associated with the state diagram of FIG. 4A.

FIG. 8A is a state diagram of the simple missile example.

FIG. 8B is a next state map of the simple missile example with all possible combinations of input variables displayed.

FIG. 8C is a table of input variables associated with the simple missile state diagram of FIG. 9A.

FIG. 9A is an exemplary state diagram of the simple missile.

FIG. 9B is an exemplary next state map of the simple missile with those fields collapsed, which contain inactive input variables.

FIG. 9C is an exemplary table of input variables associated with the simple missile state diagram of FIG. 9A.

FIG. 11 is an exemplary boolean array that stores the boolean equations for the two output bits identified therein.

DESCRIPTION OF THE PREFERRED EMBODIMENT

Figure 1:
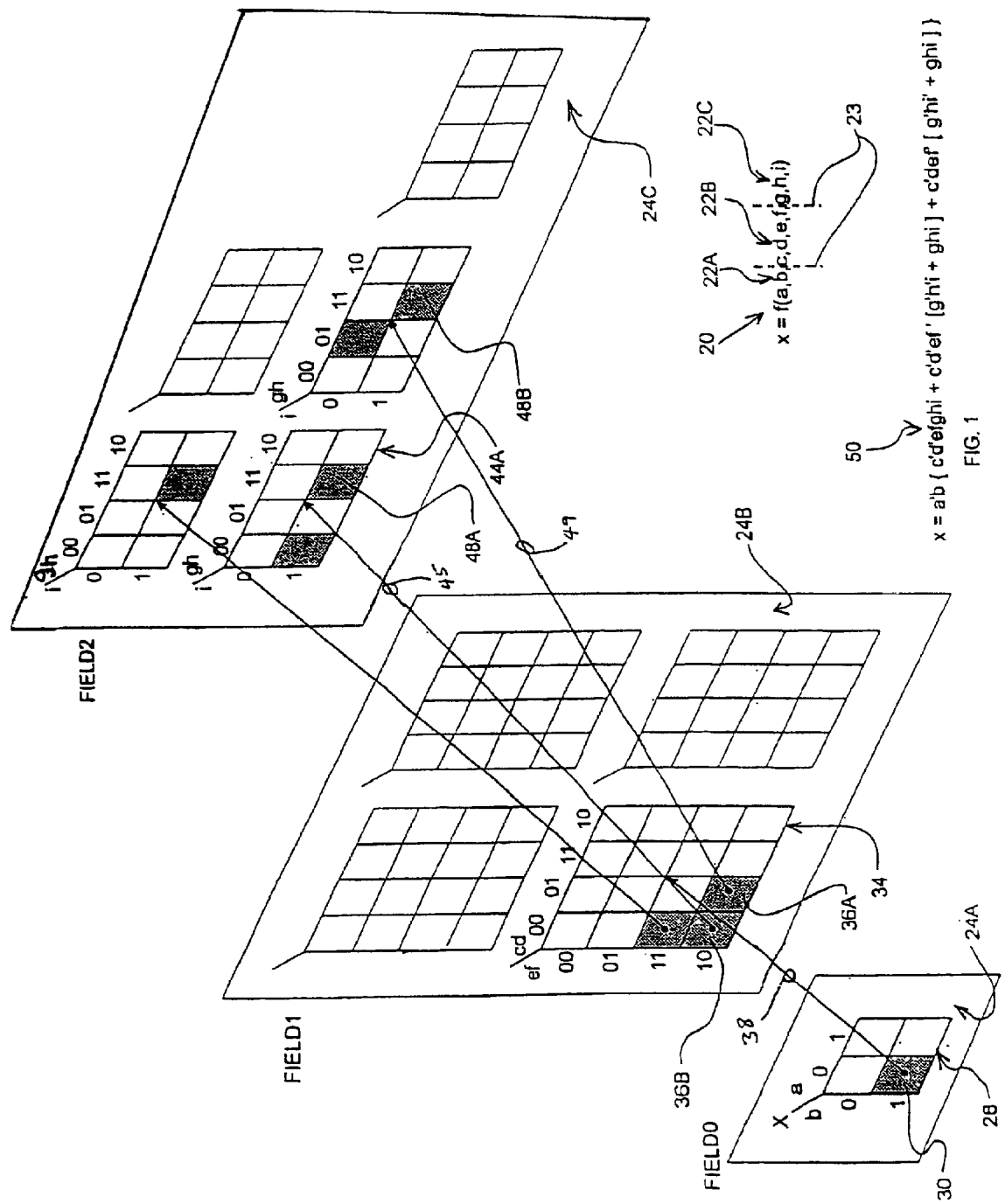
FIG. 1 is a pictorial illustration, in accordance with the preferred embodiment of the present invention, displaying a transform which relates a binary output variable to a plurality of binary input variables.

Referring now to the drawings, in which like numerals represent like components or steps throughout the several views, FIG. 1 displays a pictorial illustration of a method, in accordance with a preferred embodiment of the present invention, of representing a transform (also referred to herein as a "function") 20 which relates a binary output variable, x, to a plurality of binary input variables, a–i. It should be understood that, as used herein, the term "input variables" refers, for example and not limitation, to input signals to a combinational circuit or to present flip-flop states in a sequential state machine. Similarly, it should be understood that, as used herein, the term "output variables" refers respectively, for example and not limitation, to a combinational circuit output signal or a flip-flop next state which may be expressed, or modeled, as a transform of a plurality of such input variables.

According to the method, the input variables have been separated into successive fields 22A, 22B and 22C, as indicated by broken lines 23. These successive fields 22A, 22B, 22C are respectively represented pictorially in FIG. 1 by a plurality of successive planes 24A, 24B and 24C. In the first plane 24A, a first field combination map in the form of a Karnaugh map 28 (Karnaugh map fundamentals may by found in any standard reference in the art, including, *Digital Logic and Computer Design*, by Thomas McCalla, Macmillan Publishing, 1992) is provided having cells each representative of one binary combination of the first field variables. For example, cell 30 represents a'b (wherein the convention of a=true and a'=false is used herein with the term "true" represents a binary "one" and the term "false" represents a binary "zero"). In accordance with typical Karnaugh map usage, the binary variable (x), being expressed as a transform, is shown in the upper left hand corner of the map 28. In the successive plane 24B, a successive field combination map is provided having cells each representative of one binary combination of the successive field variables (e.g., cell 36A represents the successive field variable binary combination cd'ef'). A different one of these successive field combination maps is then assigned to each cell of the preceding plane 24A (and, hence, the preceding field 22A).

For example, combination map 34 is assigned, as indicated by arrow 38, to cell 30 of plane 24A. This process of defining and assigning successive field combination maps is continued in each successive field and terminates, in this example, with the plane 24C where a last field combination map has been defined and a different one thereof assigned to each cell of the preceding plane 24B. For example, combination map 44A has been assigned, as indicated by arrow 45, to cell 36B of plane 24B. The method of the present invention thereby links each last field cell with one cell of each preceding field to form a field cell chain associated with that last field cell. For example, the field cell chain consisting of cells 48A, 36B and 30 are linked by arrows (field combination map assignments) 45, 38 while the field cell chain consisting of cells 48B, 36A and 30 are linked by arrows 49, 38. These chains respectively represent the binary combinations a'bc'd'ef'ghi and a'bc'def'ghi. Thus, the cells of each field cell chain represent one binary combination of the input variables. The sum of all such field chains represent all binary combinations of the input variables. Therefore, in accordance with the transform being represented, a binary value may be assigned to each field cell chain. In the preferred embodiment illustrated in FIG. 1, this assignment is made by relating the binary value with each last field cell (specifically by placing binary value within the cell).

As an illustrative example of this binary value designation process specific logic transform 50 is shown in FIG. 1. This transform is represented by entries of binary ones in appropriate cells of the last plane 24C (e.g., a one in cell 48A specifies the variable x to be true for the variable combination a'bc'd'ef'ghi.). To simplify the illustration, a zero entry has been indicated by leaving a cell blank; cells not shown are considered to also contain a zero entry. For clarity of illustration in FIG. 1, only those combination maps of planes 24A, 24B and 24C containing field cell chains assigned a binary value are shown in heavy outline and the cells associated with those field chains are cross hatched. Other combination maps are shown in outline (or, are not shown in plane 24C). It should be understood, however, that there are sixty-four (64) last field combination maps in the plane 24C (i.e., a combination map assigned to each cell of the preceding plane 24B). Each last field cell is associated with a different field cell. Thus, a general transform may be represented by the method of the present invention to be extended indefinitely to any number of input variables.

Figure 2:
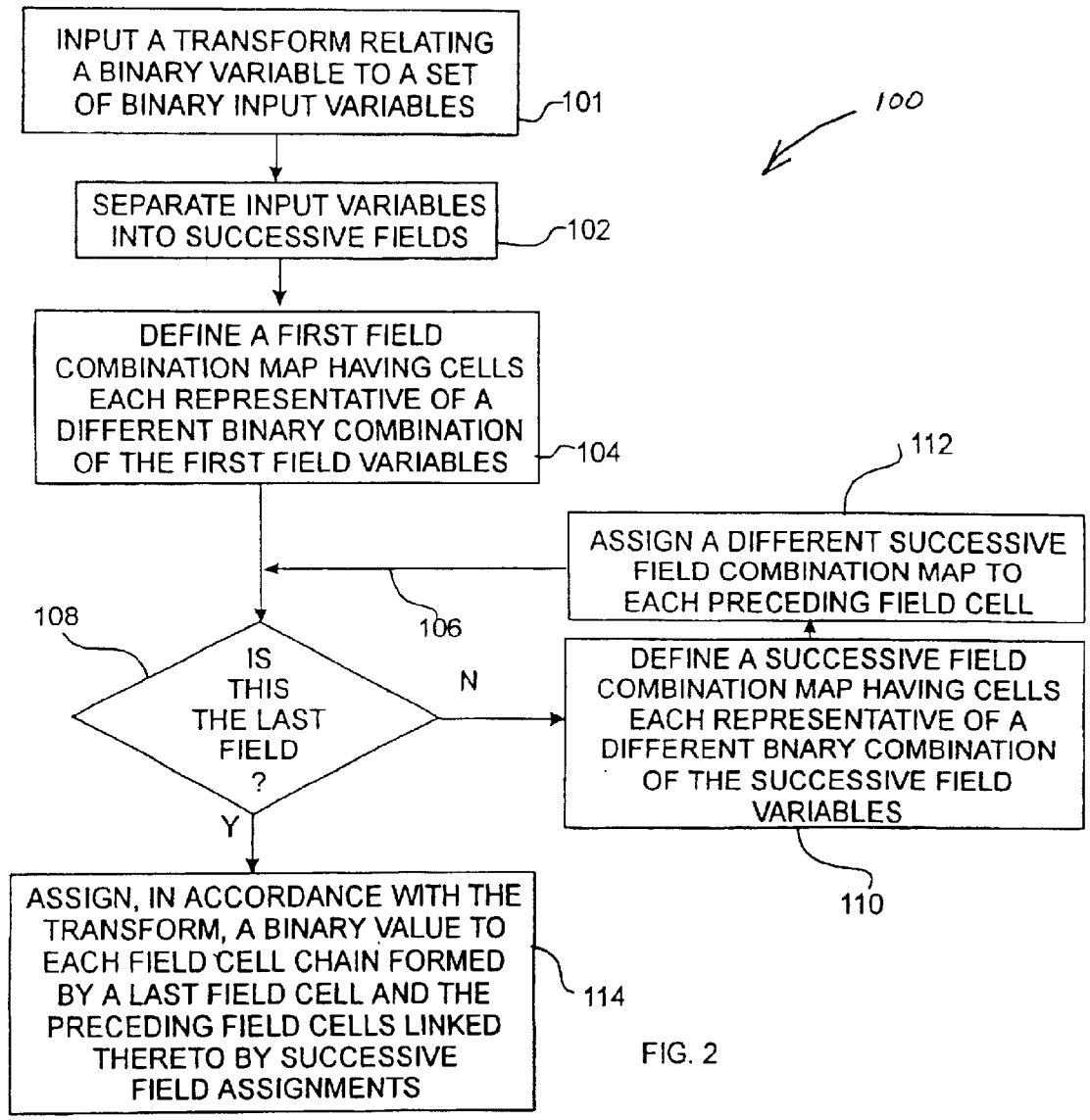
FIG. 2 is a flowchart representation of a method of representing a transform which relates a binary output variable to a plurality of binary input variables.

Although the method of the present invention may be practiced in a variety of ways, it finds particular utility especially when a large number of input variables are present, with a computer programmed to perform and executing the method steps. Accordingly, the flowchart of FIG. 2 illustrates the basic steps of the method 100 as they may be realized by those skilled in the art with any suitable programming language and a compatible computer performing the steps of the method 100. The method 100 begins at step 101 where a transform relating a binary output variable to a plurality of binary input variables is input by a user and received by application program 234. At step 102, input variables are separated into successive fields. At subsequent step 104, a first field combination map having a different cell for each binary combination of first field variables is defined. The loop 106 defines a field combination map for a successive field at step 110 and assigns a different one thereof to each preceding field cell at step 112. The loop 106 terminates with the last field and then, at step 114, in accordance with the transform of step 101, a binary value is assigned to each field cell chain formed by a last field cell and the preceding field cells linked thereto by successive field assignments. As described above relative to FIG. 1, one preferred embodiment assigns these field cell chain binary values by relating a binary value with each last field cell.

FIG. 3A is a flow chart representation of a method 120 which may be used to implement step 112 of the method 100. In accordance with the preferred embodiment, a different successive field combination map is created, at step 123, for each preceding field cell. Then, a unique identifier (e.g., a number) is assigned, at step 124, to each of those preceding cells and is associated, at step 126, with a different one of the successive field combination maps. Such identifiers facilitate linkage of successive field combination maps with preceding field cells and may be particularly useful in visualizing field relations between a large number of input variables when one practices the invention on a computer. For example, these identifiers could graphically be displayed as the numbered arrows (e.g., arrow 45) of FIG. 1.

When the method of the present invention is realized with a computer 200 it may be advantageous to provide a computer monitor graphical display 818 to aid the method user in visualizing the process of organizing the input variables into fields, defining field combination maps, and assigning successive field combination maps to preceding field cells. An exemplary embodiment of such a graphical aid is shown with the planes (e.g., plane 24A), and arrows (e.g., arrow 38) of FIG. 1. Accordingly, FIG. 3B is a flowchart illustrating the steps of a display method 130 that supplements the method 100 of FIG. 2. At step 132, the first field combination map is displayed as a cell array in a simulated three dimensional plane. Each successive field combination map is displayed, at step 134, as an array in a similar plane arranged somewhat behind the first field plane. At step 136, each successive field map is connected to its preceding field cell with a displayed arrow to show the relationship between the field maps and field cells. Finally, at step 138, the assigned field cell chain binary value is displayed in the associated last field cell.

One practicing the invention with combination maps comprising Karnaugh maps (as in the preferred embodiment of FIG. 1) may find it advantageous to restrict the number of input variables assigned to each field so that the Karnaugh map for each field is easy to visualize (e.g., when displayed on a computer screen). Although the separation of variables into fields is generally arbitrary, one practicing the invention may enhance their use of the invention by having the computer on which the method is implemented group, under program control, specific variables in one field (e.g., all input variables associated with a single source circuit, a single function of a circuit or all flip-flop output states in a sequential state machine).

It should be understood that "combination map" and "cell" are specific terms referring, respectively, to any logic combination representation technique and elements thereof used to designate specific binary combinations. Accordingly, while the embodiment illustrated in FIG. 1 employs Karnaugh maps such as the map 30, the invention generally comprises the use of any logic combination representation technique (e.g., truth tables, Quine-McCluskey method, variable entered maps).

The invention, as previously noted, facilitates design and analysis of combinatorial networks and sequential state machines. In the case of sequential state machines, the cells of a field may represent the sequential states obtained with flip-flops. In that case, field combination maps in the form of Karnaugh maps may contain more cells than states (since such maps always have 2N cells where N is the number of variables). For example, if A and B are flip-flops used to create 3 states in a state machine, a and b in the Karnaugh map 28 of FIG. 1 might indicate the last state output of each flip-flop A, B and the variable x would then be replaced by a symbol A+ indicating the next state output of flip-flop A. In this case, the map 28 indicates one more state is available (cell) than is required. The invention facilitates following all paths to or from this state to allow the user to make decisions thereabout (e.g. insure that all paths from such a state lead back to one of the three valid states).

The invention may be further illustrated with reference to such a specific sequential state machine example, termed the "Safe Missile System". This system is designed to control a missile launcher firing a strategic offensive nuclear device that, in order to avoid the inadvertent start of a nuclear war, should be fired only under the proper conditions and in the right sequence of events. In this system, there are four input signals: "FUEL"—indicating presence of fuel, "COMPTR"—indicating computer system ready, "AIMED"—indicating missile guidance aimed at the target, and "BUTTON"—indicating a go button pushed by an operator. These inputs are, respectively, denoted by the input variables w, x, y and z as shown, for reference, in table 138 of FIG. 4G. There are also four states of the system: "READY"—indicating the missile has been prepared for firing, "AIM"—indicating the missile guidance has acquired and locked onto the target, "FIRE"—indicating the missile has been fired, and "INVALID"—indicating that an incorrect sequence has occurred. The four states are shown, each with an assigned reference number from 0 to 3, in the state transition diagram 140 of FIG. 4A. The state transition diagram 140 also indicates transitions, each with an assigned reference number from 0 to 8, between states.

In the Safe Missile System, the transitions between states, in response to input signal combinations, are to occur as follows. Transition 1 (from state 0 to state 1) will occur when FUEL and COMPTR are true and AIMED and BUTTON are false. Transition 2 (from state 1 to state 3) will occur when FUEL, COMPTR, AIMED and BUTTON are true. Transition 3 (from state 0 to state 2) will occur when AIMED or BUTTON are true. Transition 4 (from state 1 to state 2) will occur when FUEL or COMPTR are false or AIMED is false and BUTTON is true. Transition 5 (from state 3 to state 2) will occur when FUEL or COMPTR or AIMED or BUTTON is false. Transition 6 (from state 0 to state 0) will occur when AIMED and BUTTON are false and FUEL and COMPTR are not both true. Transition 7 (from state 1 to state 1) will occur when FUEL and COMPTR are true and BUTTON is false. Transition 8 (from state 3 to state 3) will occur when FUEL, COMPTR, AIMED and BUTTON are true. State 2 is a dead state, i.e. there are no transitions from state 2. The system has one output FIRE which is true when the system is in state FIRE and false for all other states. Essentially the system stays in the READY state until FUEL and COMPTR are true which sends it to the AIMED state. If AIMED or BUTTON prematurely go true in the READY state, the system goes to the INVALID state. From AIMED it goes to the INVALID state if FUEL or COMPTR go false, also goes to the INVALID state if BUTTON goes prematurely true and goes to the FIRE state when AIMED and BUTTON go true while FUEL and COMPTR are still true. If any of the inputs go false in the FIRE state, the system goes to the INVALID state. No state transitions occur from the INVALID state.

Since there are four sequential states to be obtained, two flip-flops will be required (four states can be described by two binary state variables; 2*2=4) to implement this system. If the output of these flip-flops are denoted "A" and "B", the binary combinations thereof can be assigned to the sequential states as shown in the next state map of FIG. 4B which indicates next states resulting from input and flip-flop present state combinations. For example, in the combination map 160, the binary combination A'B has been assigned to state 2. The state transitions described above relative to the state transition diagram of FIG. 4A can then be entered in combination maps 162,164, 166 and 168 of the next state map of FIG. 4B. For example: cell 169 of combination map 168 indicates that state 0 of combination map 160 transitions to state 1 for w and x true and y and z false; cell 170 of combination map 166 indicates that state 1 of combination map 160 transitions to state 3 for w, x, y and z true; and cell 171 of combination map 164 indicates that state 3 of combination map 160 transitions to state 3 for w, x, y and z true while the remaining cells of combination map 164 indicate that state 3 transitions to state 2 for all other input combinations of w, x, y and z.

There are three transforms that describe the circuits to realize the Safe Missile System. These respectively express the system output FIRE and the next states A+ and B+ of the flip-flops A, B in terms of the four input signals w, x, y and z and the two flip-flop present states A and B. For this example, the transform for the next flip-flop state A+ will be represented using a method in accordance with the present invention. It is seen, from the assignment of states in combination map 160, that the next output state A+ of the flip-flop A will be true when the system goes to states 1 or 3. Looking at the response of system sequential states, in response to flip-flop present states A, B and input signals w, x, y and z in FIG. 4B for the states 1 and 3, leads to the transform:

$$A+=A'B'wxy'z'+AB'(wxz'+wxyz)+ABwxyz.$$

In this example, it has been assumed that the flip-flops A and B are D flip-flops so that the output follows the input. Thus, the transform above represents both the flip-flop A's next state output and input. If other flip-flop structures (e.g., JK flip-flops) were used, their transfer function would need to be applied to realize a transform relating the input of the flip-flops to the input variables and present flip-flop states. Such a transform could then be used to design a circuit that would realize the Safe Missile System.

Figure 5:
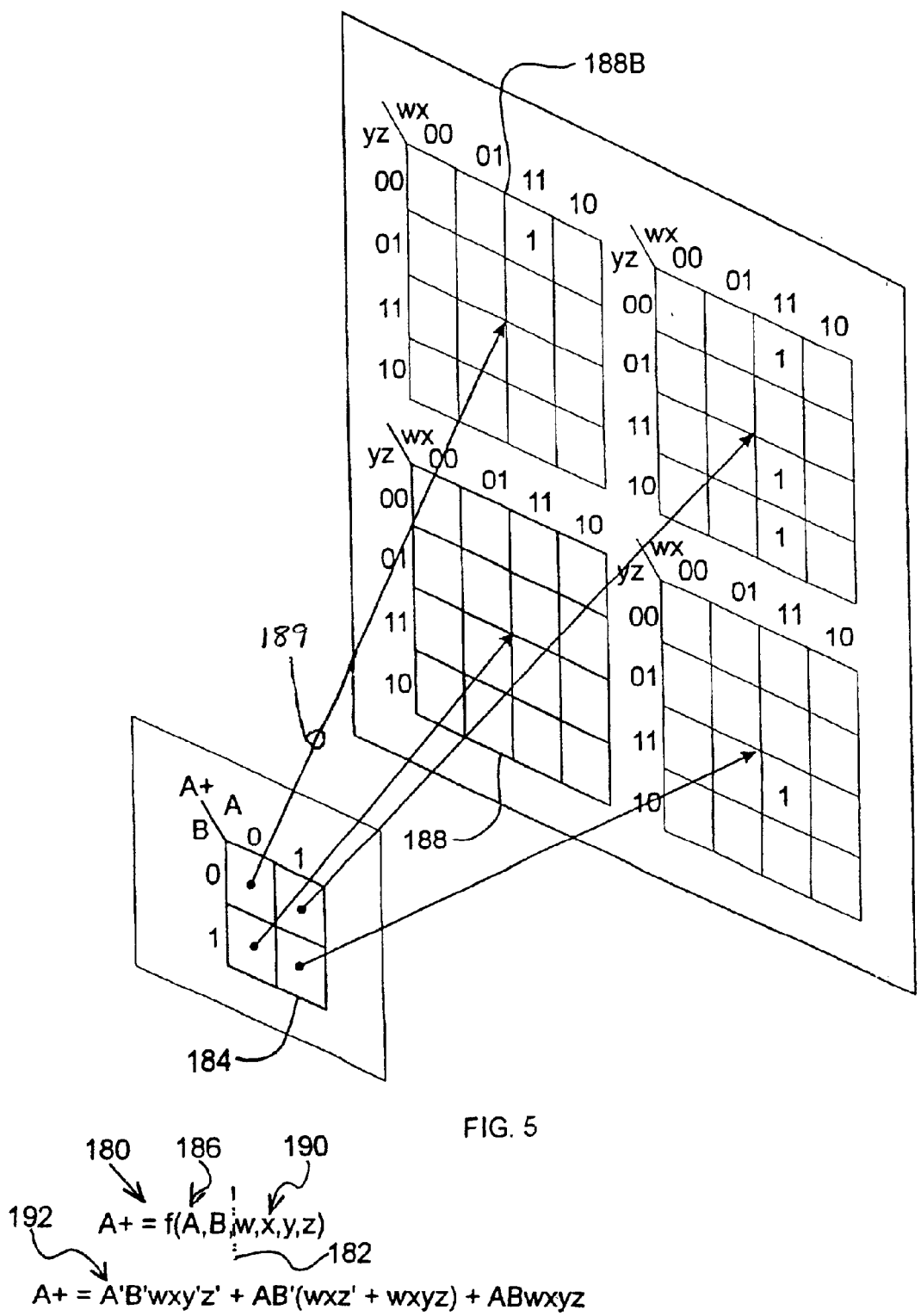
FIG. 5 is a pictorial illustration of a preferred method embodiment for representing one of the transforms associated with the next state map of FIG. 4B.

A method, in accordance with the present invention, of representing the sequential state transform for A+ is graphically illustrated in FIG. 5, where the general transform 180 has been separated into fields as shown by the broken line 182. A combination map 184 is defined having cells representing all binary combinations of the variables of the first field 186 (again, as in FIG. 1, shown graphically as an array in a first plane). Next, a combination map 188 is defined having cells representing all binary combinations of the second field 190 of variables (shown graphically as a second plane). A different one of the combination maps 188 is assigned to each preceding field cell. For example, combination map 188A is assigned to the cell representing the first field variable combination A'B' as indicated by the arrow 189. This process, thereby, links one cell of the preceding field with each last field cell to form an associated field cell chain. The cells of this chain represent one binary combination of the input variables. Finally, in accordance with the specific A+ transform 192, a one or zero is assigned to each last field cell chain. In this method, the assignment is made by relating the binary value with the last field cell. For clarity of illustration, only binary ones have been entered in the last field cells of FIG. 5. All other cells, in this example, are understood to contain a binary zero.

Figure 6A:
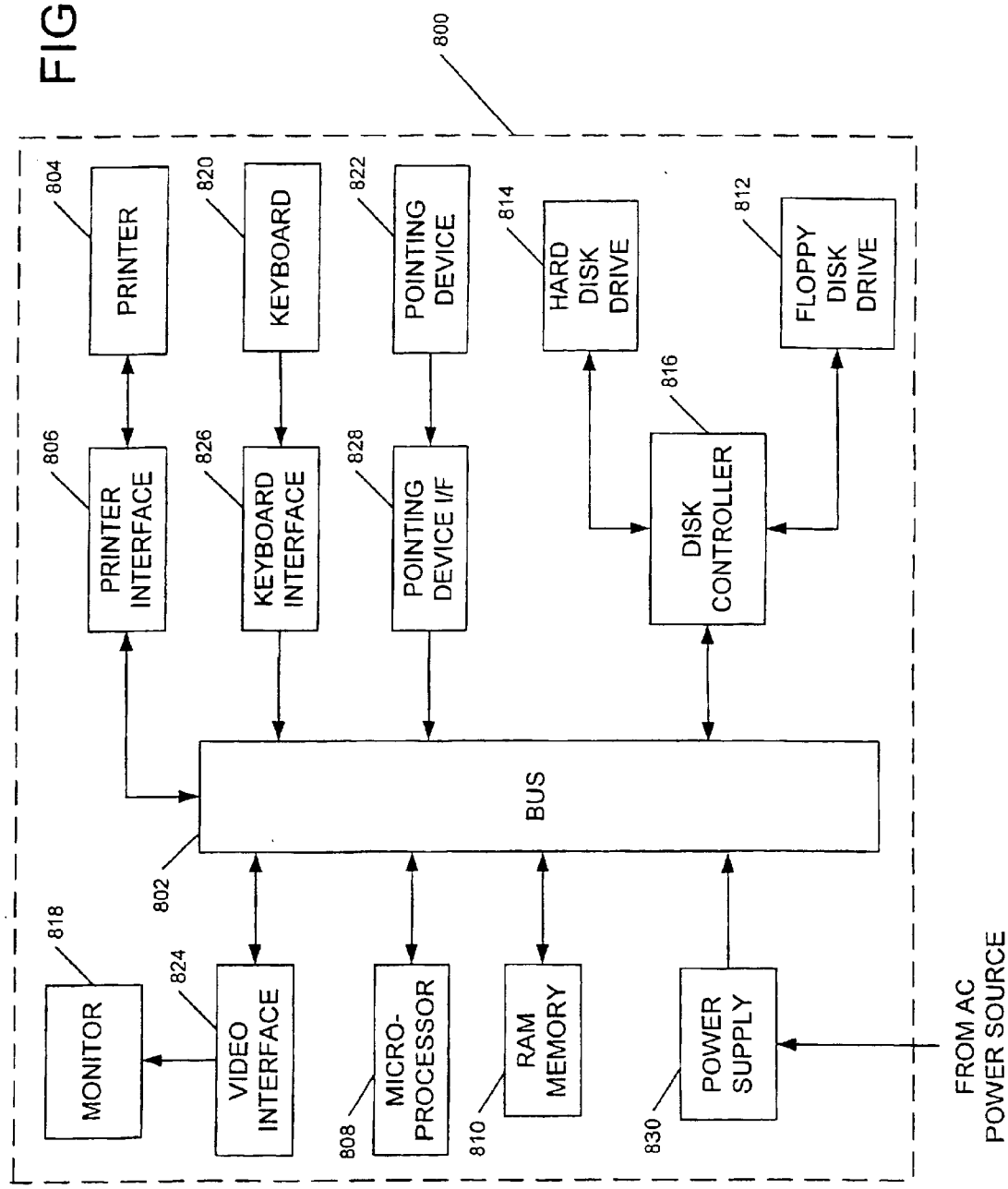
FIG. 6A is a block diagram representation of a computer apparatus in accordance with the preferred embodiment of the present invention.

FIG. 6A displays a block diagram representation of a digital computer apparatus which is operable to perform steps in accordance with the methods of the present invention. As seen in FIG. 6A, the computer 800 comprises a bus 802 which connects to a printer 804 through a printer interface 806. The bus 802 connects directly to a microprocessor 808 and random access memory (RAM) 810. A floppy disk drive 812 and a hard disk drive 814 connect to the bus 802 via a disk controller 816 which directly interfaces with the bus 802. A monitor 818, keyboard 820 and pointer device 822 connect to the bus 802 through a video interface 824, keyboard interface 826 and pointer device interface 828, respectively. The bus 802 connects to a power supply 830 which connects, preferably, to an alternating-current (AC), electrical energy source (not shown). An exemplary computer 800, acceptable according to the preferred embodiment, is an IBM compatible computer having an Intel Pentium-class microprocessor operating a clock speed of 133 MHz and sufficient random access memory and hard disk storage capacity. It is understood that the scope of the present invention encompasses other types of computers capable of performing the steps of the method of the present invention. It is further understood that the scope of the present invention also comprises other apparatus which are capable of binary expression including, for example and not limitation, relays and lights (e.g., light emitting diodes).

Figure 6B:
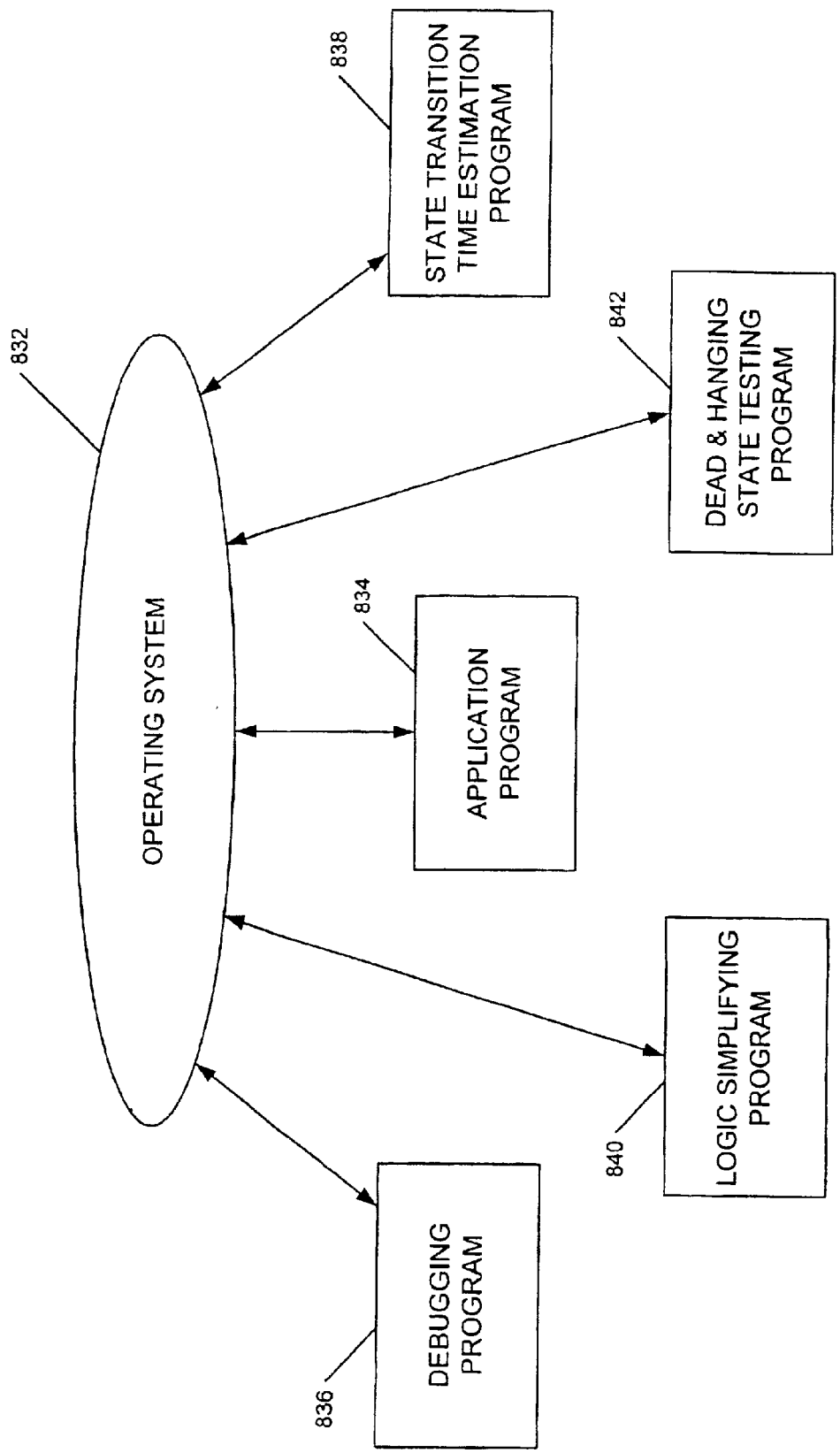
FIG. 6B is a block diagram representation of a program and data domain of the computer apparatus of FIG. 6A.

FIG. 6B is a block diagram representation of a program and data domain of the system of the preferred embodiment of the present invention. In the preferred embodiment, the program and data domain represents programming found on the computer 800, which is executed by the microprocessor 808 using RAM 810 and program and data files which are stored on the hard disk drive 814. The program and data domain includes a multi-tasking operating system 832 and an application program 834 comprising executable computer instructions for representing and displaying a mathematical transform between a binary output variable and a set of binary input variables and for performing other steps and tasks described herein in accordance with the method of the preferred embodiment. Microprocessor 808 executes the instructions of the application program 834, upon initiation by a user of the application program 834, and interacts with monitor 818 to appropriately display combination maps to the user, and interacts with keyboard 820 and pointer device 822 to receive input from the user. One example of a multi-tasking operating system 832, acceptable in accordance with the preferred embodiment of the present invention, is the Microsoft Windows 98 operating system available from Microsoft Corporation of Redmond, Wash. It is understood that the application program 834 may be programmed in one of many acceptable programming languages, including, for example and not limitation, the Pascal programming language. The program and data domain, preferably, further includes other programming associated with logic design, including, but not limited to, a debugging program 836, a state transition time estimation program 838, a logic simplifying program 840, and a "dead" (i.e., no next state) and "hanging" (i.e., states having no entry states) state testing program 842.

Figure 7:
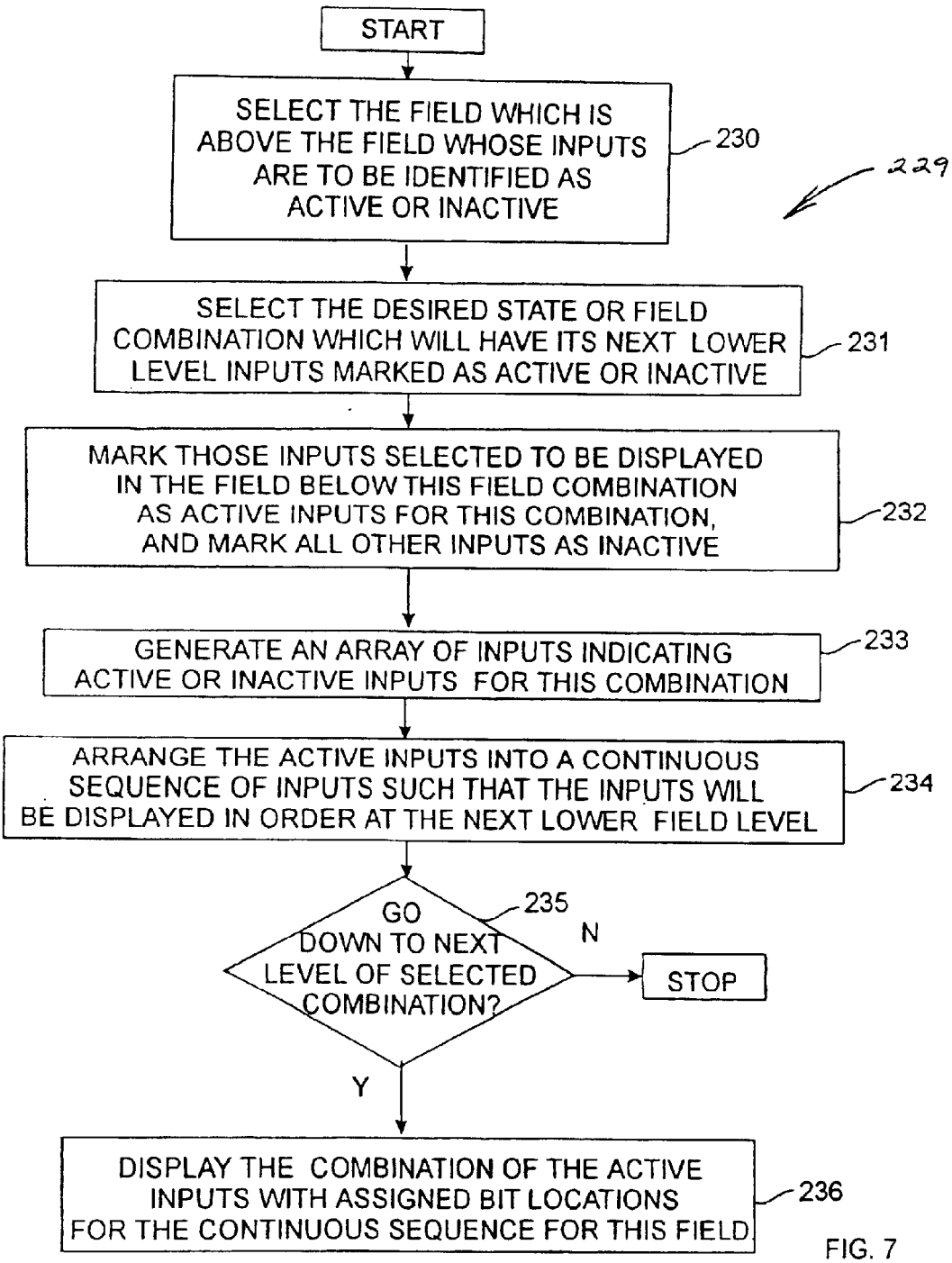
FIG. 7 is a flowchart representation of a method of marking input variables that are active and inactive, and displaying the combination of active inputs.

Although the method of the present invention provides for a large number of variables to be examined, the combinatorial explosion makes assignment of each individual combination burdensome. In order to alleviate this problem, the number of variables that are displayed can be reduced to only those variables that affect the output. According to the preferred embodiment of the present invention, as illustrated in the flowchart of FIG. 7, the method 229 allows only selected outputs to be displayed. One of the fields of input variables presented to the transform is selected at step 230. The selected field corresponds to one of the levels or planes. If it is not the top field, then this field would have a combination with which it is associated. Within that field, one of the combinations of inputs of that field is selected at step 231. This selected combination of inputs defines the lower level field combinations for which the input variables will be, at step 232, defined as active or inactive. The set of input variables that are active are then marked as active at step 232. After marking those active input variables, all other inputs for that field are set as inactive.

With the input variables marked as active or inactive, an array of inputs is generated, at step 233, to indicate which variables are active or inactive. Because the active variables must be used in the combination map display in a continuous and preferably sequential order, those active inputs are arranged, at step 234, in an array that defines the order that the active inputs will be displayed in the collapsed display. This array, in combination with the active and inactive marking of inputs, as well as the number of inputs to be displayed is used, if desired, to display the collapsed lower level combination map for that higher level combination at step 236.

FIGS. 8 and 9 display, in an example named "Simple Missile" having a missile controller, this method of displaying only selected fields. In FIG. 8, all combinations are displayed. The missile controller of Simple Missle moves through the READY, AIMED and FIRE states with no transition to the INVALID state. The controller transitions (transition 1) from READY to AIMED when FUEL, COMPTR and AIMED are true, otherwise, it will stay in state 0, as indicated by transition 3. BUTTON is a don't care (e.g. it has no effect upon the output) and has no effect on this transition, labeled transition 1. The controller transitions from state AIMED to state FIRE when input variable button is true as indicated by transition 2. For all other combinations of inputs, the controller will stay in the READY state (transition 4). All other input variables do not affect this transition and are don't cares via transition 4. The controller will stay in state FIRE for all combinations of input variables (transition 5). For all other combinations, the controller will stay in the AIMED state. The controller will also remain in state INVALID for all combinations of input variables, even though there is no entry into this state (transition 6).

In FIG. 9B, however, the display of combinations has been collapsed so that the only active inputs are the input variable combinations shown. Because the transition from the READY to the AIMED state are only affected by the input variables FUEL, COMPTR and AIMED, only those eight combinations are shown. The only combination which causes a transition out of READY (transition 1), where all three of the input variables are true, is shown. The only input variable that affects a transition from state AIMED is BUTTON, so only two combinations are shown. If BUTTON is true or 1, the controller will transition to state 3 named FIRE (transition 2), else it will remain in state 1 named AIMED (transition 4). The FIRE state and the INVALID state are not affected by any input variables, so they stay in the same state (transitions 3 and 4, respectively), as represented by a single combination of no inputs. In accordance with the present invention, the method reduces the amount of computer memory storage needed as a result of the combinatorial explosion of combinations of input variables, thereby enabling a less powerful computer to do more. The method accomplishes this reduction by encoding the transform in a linear array of storage locations. Such encoding enables the size of the transform's description to grow linearly with the complexity of the transform, rather that exponentially with the number of inputs. The encoding is an important feature that expands the number of practical applications for the present invention.

The method encodes a boolean equation that maps input variables to an output, using a linear array of storage locations. One of the locations contains the number of equations already encoded in this transform. Each encoded equation corresponds to an output bit of the transform. The equation either sets or resets that output bit of the transform, depending upon an indicator, such as an ordinal value in that location, which signals that this particular output bit is to be set. Another indicator, such as a single bit in that location, indicates whether the output bit is asserted or not asserted. In typical representations of the art, each equation would be in the form of a product of sums or a sum of products. In the preferred embodiment, and in this example, we will use the sum of products, where several minterms are made of anded inputs that are ored together. This equation is used to test a combination of inputs that is presented to the transform to determine whether the outputs of the transform are high or low. The determination of whether an output bit is high or low is described by the flowchart in FIG. 10.

Another location (which is also an element of the linear data store) identifies the location of the end of the array. This end of array delimiter enables another equation to be added. Another location shows the number of equations encoded in the array. Another location shows the number of storage locations needed to represent all output bits. For example, if the number of bits in a storage location were 8, then at least 2 storage locations are needed to represent a transform with 10 output bits. Two locations would be needed because the first storage location would contain 8 of the 10 bits and the next location would contain the remaining 2 of the 10 bits.

Another location identifies which bit is to be asserted by the encoded equation that follows and indicates, perhaps by a bit in that storage location, whether that output bit is high, or true, when the input variable conditions are satisfied and the output bit is asserted. Another location, perhaps the next storage location, contains the number of minterms in the equation. Another location, perhaps the next location, contains the number of variables in the first minterm of the first equation. Another location, perhaps the next, contains the first variable identifier of the first minterm of the first equation and an indicator as to whether this identifier is noted or not noted.

The variable identifiers describe whether the inputs presented to the transform must be high or low in order for that minterm to be asserted in the equation. Another location, perhaps the next location, contains the second variable identifier of the first minterm of the first equation and an indicator as to whether it is noted (0 or false) or not noted (1 or true).

The variable identifiers of the first minterm of the first equation continue until all variable identifiers in the first minterm are listed. Then, the number of variables in the first minterm of the first equation is stored at the next location. This variable count is duplicated so that the algorithm, which is used to construct the encoded array, can backtrack and place the number of variables before a minterm after the number of variables for that minterm is known. After this first minterm description, the next minterm, if any, is described by a location containing the number of variable identifiers, then the variable identifiers for that minterm, then the number of variable identifiers is repeated for that minterm.

If another equation were encoded in this array, then the next location would include a numeric value that would indicate which bit is to be asserted. In the same location, there would also be another indication, such as a single bit, that if asserted, is to be asserted as a set (high, 1) or reset (low, 0). The next location would then show the number of minterms in that equation. Then, the number of variable identifiers for that minterm is found. Then, the identifiers and the indication as to whether they are to be noted or not noted, then the repeat of the number of variable identifiers, then the next minterm of that equation, or the beginning of the next equation, and so forth.

Figure 10:
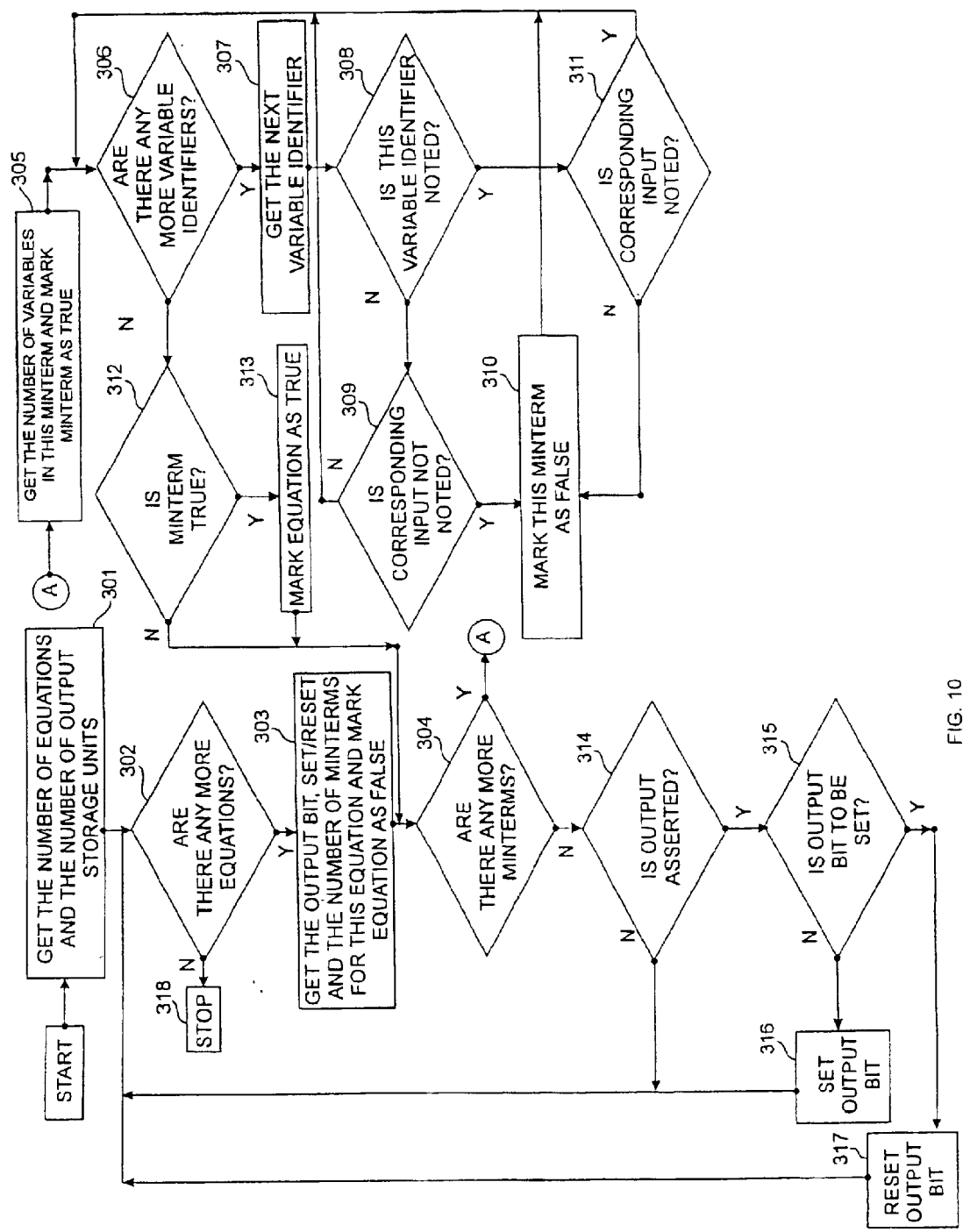
FIG. 10 is a flowchart representation of a method of interpreting an array that has encoded a boolean expression.

FIG. 10 describes the method of the present invention as used to interpret an already encoded array. The method takes a combination of inputs presented to the transform and determines whether the output should be asserted or not asserted, and if asserted, whether that output bit should be high or low. The method begins, at step 301, by getting the number of equations and the number of storage locations needed for an output and the number of storage locations needed to describe the input identifiers. Then, the method compares the array location pointer to the end of array delimiter at step 302. If the pointer is at the end of the array, the method stops at step 318. If this delimiter is not the end of the array, the method, at step 303, gets the location that specifies which output bit is to be asserted and reads the indication as to whether this equation's output bit, if asserted, is to be true or false. Then, the location, which specifies the number of minterms in this equation, is read. If there are still more minterms as determined at step 304, the method gets the number of variables in this minterm and marks the minterm as true at step 305. Marking this minterm as true is done so that if any one of the variable identifiers is not the same as the inputs presented to the transform, then the whole minterm will be marked as false. This implements an "and" operation of the whole minterm.

The method then determines if there are any more variable identifiers. If the array has more variable identifiers, then the method gets the next variable identifier at step 307. The method determines if the retrieved variable identifier is noted at step 308. If it is not noted, the method checks, at step 309, to see if the corresponding input is not noted. If the corresponding input is not noted, the method returns to check for an equivalence between the next variable identifier and the corresponding input. Otherwise, the method marks this minterm as false and returns to check the equivalence between the next variable identifier and the corresponding input, if there are more variable identifiers. If the value is noted, the corresponding input is checked to see if it is noted. If the corresponding input is noted, no action is taken and the method checks for any other variables. If the corresponding input is not noted, then the method marks the minterm as failed at step 310, and checks the next variable identifier. If there are no more variable identifiers, the method checks, at step 312, to determine whether the minterm was left or remained marked as true. If the minterm remained marked as true, then the entire equation is marked as true at step 313. If the minterm was marked as true, then the entire equation is marked as true 313. If the minterm was false, no action is taken and the method determines, at step 304, whether other minterms exist.

If the method determines, at step 304, that there are no more minterms, the method checks, at step 314, to see if the output is asserted. If the output is not asserted, no action is taken and the method checks the next equation, if there is another equation. If the equation is asserted, the method checks, at step 315, to see if the output bit is to be set or reset when asserted. If the output is to be set, the method sets the output bit at step 316 and overwrites and sets to one (1 or true) any previous equation value for this bit. If the output bit is not to be set, the output bit is reset at step 317 and any previous equation for this output bit has it's result overwritten by a zero, false or low value for that bit.

To avoid unnecessary operations, in an alternate embodiment, the method may branch out of the loop to affect an "and then" or an "or else" where no more of the "anded" variables are tested. The reason this branch out of the loop can be made is that if one input does not match what the variable identifier should be, then the whole minterm is false, or no more of the minterms are tested, since one is already true.

FIG. 11 displays, in accordance with the preferred embodiment, an array comprising a plurality of storage locations in a random access memory of a digital computer for storing equations in an encoded form. To illustrate use of the array for so storing equations, two exemplary equations 417, 418 are employed in the description that follows. The first equation 417 outputs bit zero, where bit zero is indicated as to be set, if the equation is true or asserted, by the most significant bit number fifteen 402 in a range of zero to fifteen. The second equation 418 outputs bit three reset, as indicated by the most significant bit fifteen 412 reset or zero. Storage location 403 stores the number of minterms (i.e., two) for the first equation 417. Storage location 404 stores the number of variables in the first minterm of the first equation 417. Storage location 405 stores the first variable identifier (i.e., 16384) of the first minterm of the first equation 417. The most significant bit, bit fifteen, is set to indicate that this variable identifier is to be noted. Storage location 406 stores the second variable identifier (i.e., 1) of the first minterm of the first equation 417 and this variable is not noted as indicated by bit fifteen being zero. Storage location 407 stores the third variable identifier (i.e., 16386) of the first minterm of the first equation 417, which is the addition of the most significant bit set for a noted variable, and the value, which is two. Storage location 408 stores the number of variables (i.e., 3) in the first minterm of the first equation 417. Storage location 409 stores the number of variables in the second minterm (i.e., 1) of the first equation 417. Storage location 410 stores the first variable identifier of the second minterm of the first equation 417. Storage location 411 stores the number of variables in the second minterm of the first equation 417. Storage location 412 stores the bit location of the second equation 418 and will be reset if the second equation 418 is asserted because most significant bit fifteen is not set to a value of one. Storage location 413 stores the number of variables in the first minterm of the second equation 418 and has a value of one. Storage location 414 stores the first variable identifier of the first minterm of the second equation 418 and has of value of one. Storage location 415 stores the number of variables in the first minterm of the second equation 418 and has a value of one. Storage location 416 stores an end of array designator.

With the two equations 417, 418 encoded in the array, if the combination of inputs presented to the transform is a binary (i.e., base 2) six, where input0 has a value of one, input1 has a value of zero, and input2 has a value of one, then bit zero of the first equation 417 has a value of one. Bit zero has a value of one because the first minterm of the first equation 417 is asserted and has a value of one. Bit three has a value of zero because the first and only minterm having only one variable is noted because input1 has a value of zero. Therefore, bit three is asserted, but is asserted as a value of zero.

Figure 12:
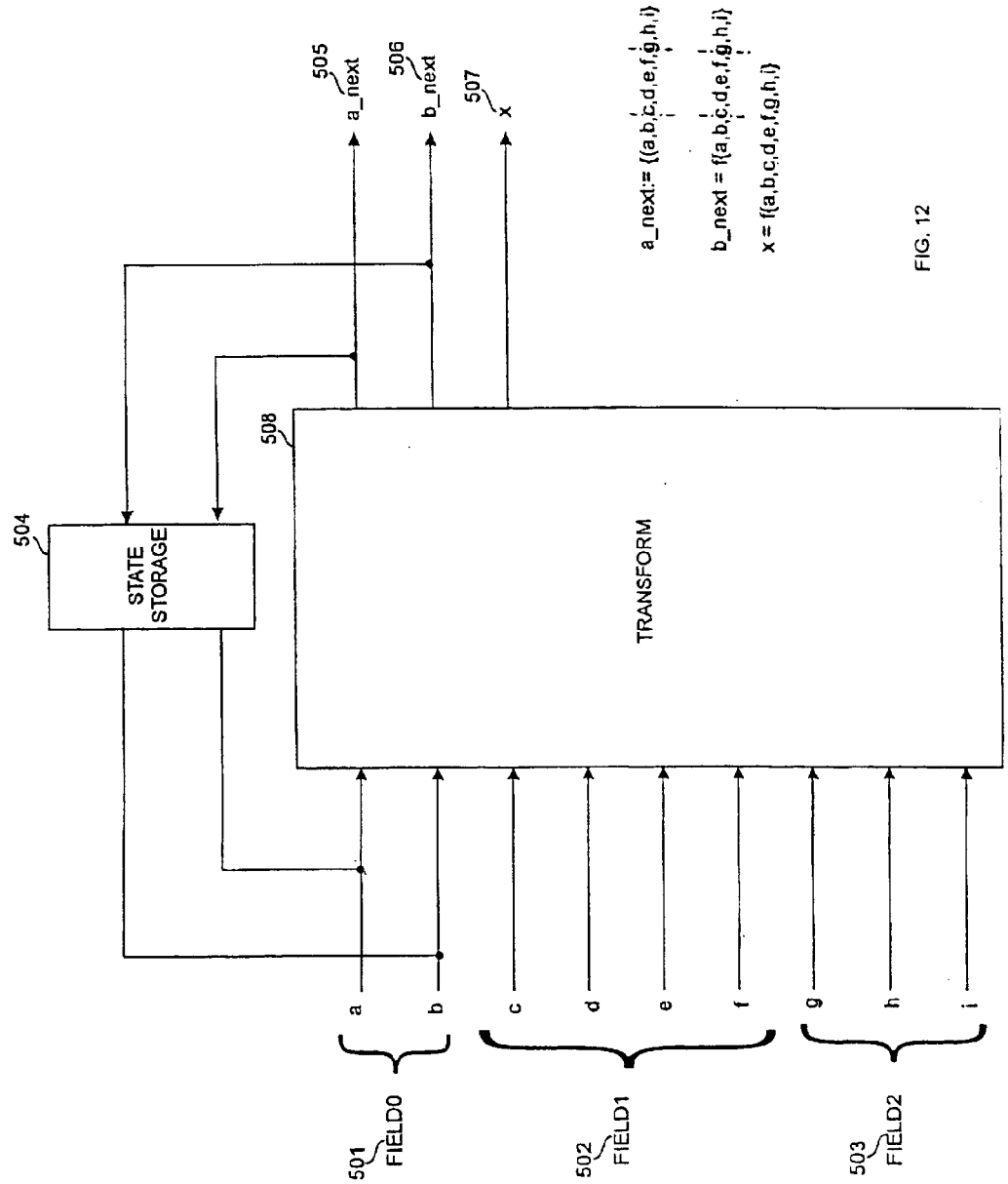
FIG. 12 is a pictorial illustration of the assignment of fields for the transform displayed in FIG. 1.

FIG. 12 is a schematic diagram displaying, in an exemplary manner, the assignment of fields to the mapping of input variables a, b, c, d, e, f, g, h and i to output variables a__next 505, b__next 506 and x 507. The outputs a__next 505 and b__next 506 and x 507 are functions of input variables a, b, c, d, e, f, g, h and i, which are assigned to a plurality of fields, including FIELD0 501, FIELD1 502, and FIELD2 503. The fields relate to the logic levels shown in FIG. 1. In FIG. 12, the first two input variables, a and b, represent the bits that define the states of a sequential logic machine and are fed back to the transform 508 through state storage 504. Input variables a and b define the state, so state bit field outputs of the transform are a__next 505 and b__next 506. X 507 is output of the transform 508.

Figure 13:
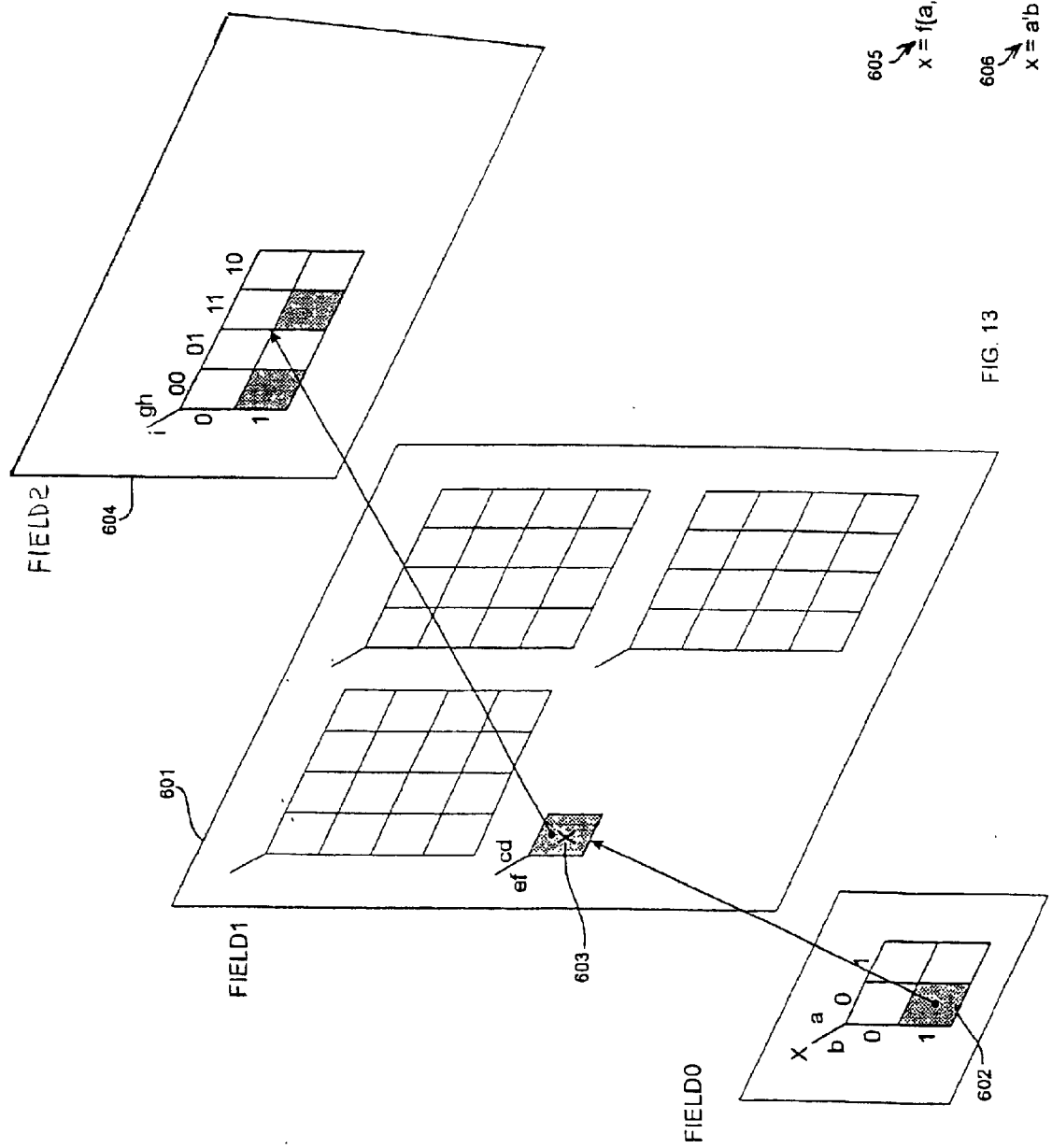
FIG. 13 is a pictorial illustration of a collapsed intermediate field for the transform shown in FIG. 1.

FIG. 13 pictorially displays the collapsing of intermediate FIELD1 for the case where the input variables of FIELD1 601 (i.e., c, d, e and f) do not affect the output x. In this illustration, the values of a and b for field 602 are zero and one, respectively. Input variables c, d, e and f may still affect the output of x for other combinations of a and b, but, in FIG. 13, affect only the lower fields of combination a'b. The whole FIELD1, which is composed of input variables c, d, e and f, is a "don't care" for combination a'b. The capital letter X (not to be confused with the output, denoted by a lower case letter x) indicates that all variables in this field of combination a'b are "don't cares". The output x is, however, affected by the input variables g, h and i which compose FIELD2. So, if input variables c, d, e and f do not affect x, then the equation for x in FIG. 1 is reduced to the equation in FIG. 13 for output x.

The method of the present invention enables restriction of the display outputs to "adjacent" changes. The term "adjacent", as used herein, means that outputs change by only one bit. The display of those adjacent values will indicate what can be used as adjacent outputs. The advantage of this output change restriction is to allow a change of outputs that does not have to wait for multiple outputs to reach their desired logical level of one or zero. In synchronous logic machines, outputs are not gated to outside logic until a time period event. This time period event is sometimes signaled by a clock change. Not having to wait for this clock change can significantly improve execution speeds of logic devices because the change can occur immediately upon the change of inputs presented to the transform.

Figure 14:
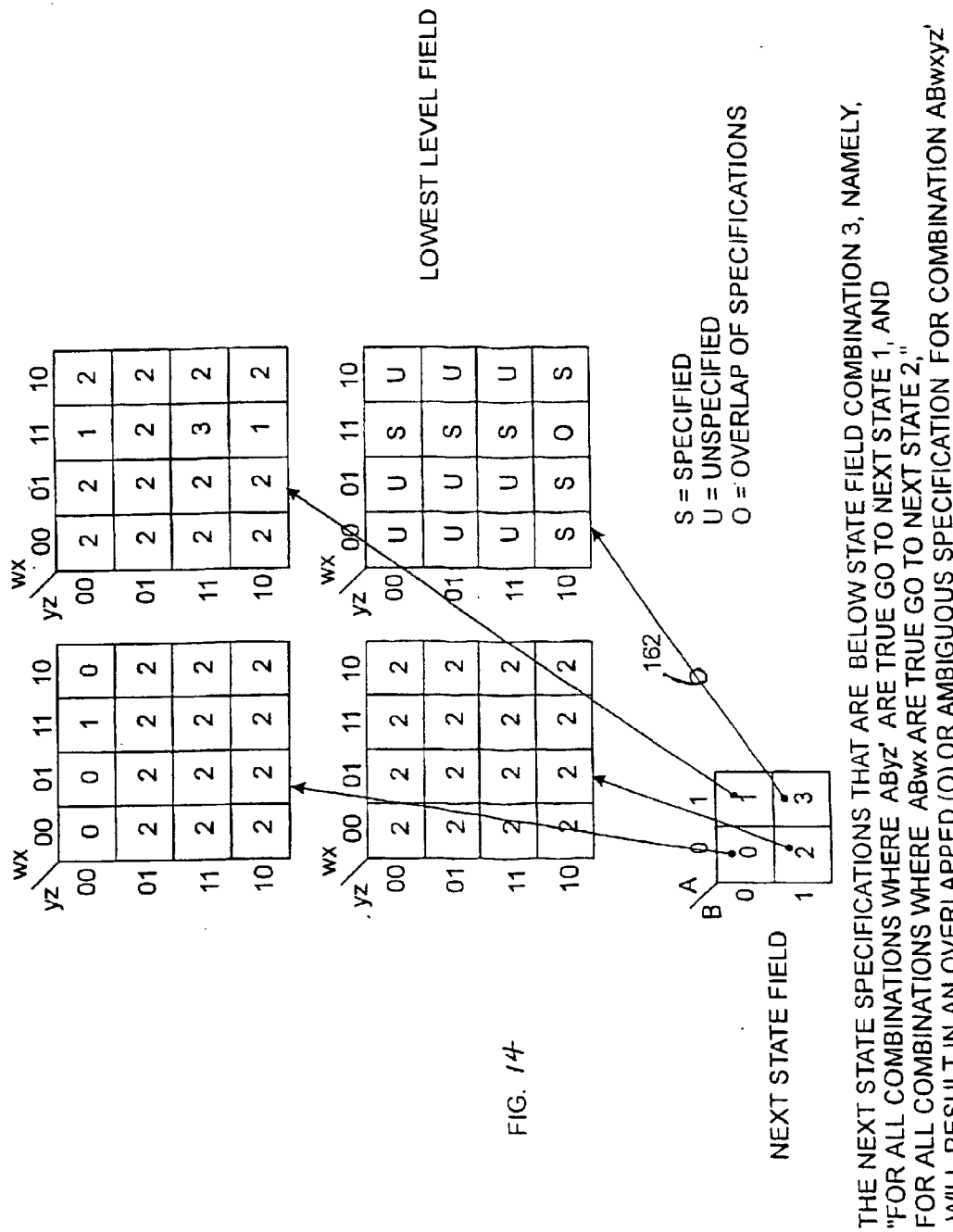
FIG. 14 is an exemplary state diagram showing ambiguous and incomplete specifications.

Entering a transform specification by using several boolean equations instead of entering a value for each combination is desirable, but use of equations may result in inadvertent errors. The method of the present invention enables a check to be made that allows the user to be notified when any new specification overwrites a previously specified combination. The user is also notified if any of the combinations has not been explicitly specified. Such testing guarantees that the specification is complete and unambiguous. FIG. 14 displays an example of a specification that is incomplete and ambiguous. In the example of FIG. 14, all next state values while in state 3 are to be set to state 1 if AByz' is true, and also set to state 2 if ABwx is true. However, these two specifications are in conflict at combination ABwxyz' and, hence, are ambiguous, and do not say anything about what the next state values should be for combinations AB(w'y'+w'z+x'y'+x'z) and, hence, are incomplete. The method of the present invention enables such 'problem areas' to be displayed to the user for explicit resolution. Implementations of logic, such as code or schematic logic diagrams, may be automatically analyzed and displayed by the method of the present invention through the use of a transform defining the relationship(s) between inputs and outputs. Therefore, the method may be used to identify ambiguous and incomplete areas in existing logic implementations.

Figure 15:
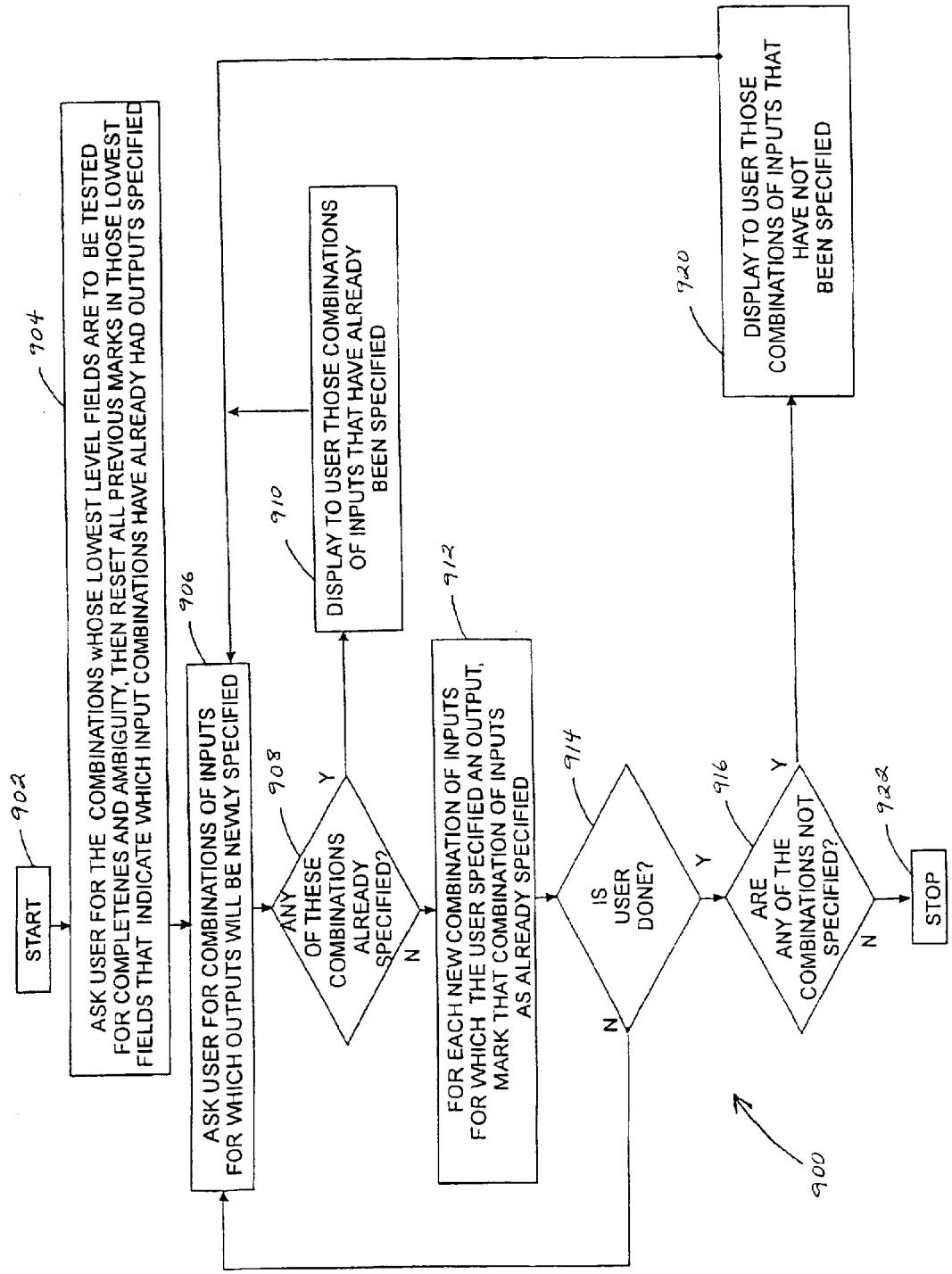
FIG. 15 is a flowchart representation of a method which displays combinations of inputs whose outputs have already been specified and combinations of inputs whose outputs have not yet been specified.

FIG. 15 is a flowchart representation of a method 900 which tests for complete and unambiguous specifications and displays combinations of inputs whose outputs have already been specified and combinations of inputs whose outputs have not yet been specified. After starting at step 902, the method advances to step 904 where the user is asked for the combinations whose lowest level fields are to be tested for completeness and ambiguity. Also at step 904, all previous marks in those lowest fields that indicate which input combinations have already had outputs specified are reset. Next, at step 906, the user is asked for combinations of inputs for which outputs will be newly specified. Then, at step 908, a determination is made as to whether any of the user input combinations has already been specified. If so, those combinations are displayed on monitor 818 at step 910 and the method loops back to step 906. If none of the user input combinations has already been specified, then each new combination of inputs for which the user specified an output is marked, at step 912, as being already specified.

Continuing at step 914, a determination is made as to whether the user is done inputting combinations of inputs for which outputs will be newly specified. If the user is not done, then the method loops back to step 906. If the user is done, then the method advances to step 916 where a determination is made as to whether any of the combinations are not specified. If so, the method branches to step 920 where those combinations of inputs that have not been specified are displayed to the user on monitor 818. Otherwise, the method stops at step 922.

Whereas this invention has been described in detail with particular reference to its most preferred embodiments, it is understood that variations and modifications can be effected within the spirit and scope of the invention, as described herein before and as defined in the appended claims. The corresponding structures, materials, acts, and equivalents of all means plus function elements, if any, in the claims below are intended to include any structure, material, or acts for performing the functions in combination with other claimed elements as specifically claimed.

What is claimed is:

1. A computer-implemented method of representing a mathematical transform between a binary output variable and a plurality of binary input variables on a computer display, the method comprising the steps of:

separating the plurality of binary input variables into a respective plurality of fields, each field of the plurality of fields corresponding to a respective display level of a multi-level display format having a top display level and at least one lower display level;

selecting a combination of the binary input variables of a first field of the plurality of fields, the first field corresponding to a first display level;

identifying combinations of the binary input variables of a second field of the plurality of fields which affect the binary output variable for the selected combination of the binary input variables of the first field of the plurality of fields, the second field corresponding to a second display level lower than the first display level;

displaying, on the computer display at the second display level, the identified combinations of the binary input variables of the second field of the plurality of fields in at least one collapsed combination map.

2. The method of claim 1, wherein the at least one collapsed combination map includes no combinations of the binary input variables of the second field of the plurality of fields which do not affect the binary output variable for the selected combination of the binary input variables of the first field of the plurality of fields.

3. The method of claim 1, wherein the step of displaying includes displaying the binary input variables of the identified combinations in a sequential order.

4. The method of claim 1, wherein prior to the step of displaying, the method further comprises a step of defining a sequential order for the display of the binary input variables of the identified combinations.

5. The method of claim 4, wherein the step of defining includes a step of generating an array identifying the binary input variables of the identified combinations.

6. The method of claim 5, wherein the step of defining further includes a step of arranging the identified binary input variables of the array in the sequential order for display.

7. The method of claim 5, wherein the identified combinations are first identified combinations, wherein the step of identifying further includes identifying second identified combinations of the binary input variables of the second field of the plurality of fields which do not affect the binary output variable for the selected combination of the binary input variables of the first field of the plurality of fields, and wherein prior to the step of generating, the step of defining further includes a step of marking the binary input variables of the first identified combinations as active and the binary input variables of the second identified combinations as inactive.

8. The method of claim 7, wherein the step of generating an array includes generating an array identifying the binary input variables of the second identified combinations.

9. The method of claim 1, wherein the identified combinations comprise first identified combinations, wherein the step of identifying further includes identifying second identified combinations of the binary input variables of the second field of the plurality of fields which do not affect the binary output variable for the selected combination of the binary input variables of the first field of the plurality of fields, and wherein the method further comprises a step of displaying, on the computer display at the second display level, the second identified combinations of the binary input variables of the second field of the plurality of fields in at least one collapsed combination map.

10. The method of claim 1, wherein the method further comprises a step of displaying, on the computer display at the first display level, the selected combination of the binary input variables of the first field.

11. The method of claim 10, wherein the method further comprises a step of displaying an indication of a relationship between the selected combination of the binary input variables of the first field of the plurality of fields and a combination of the binary input variables of a second field of the plurality of fields.

12. The method of claim 1, wherein the at least one collapsed combination map includes a Karnaugh map.

13. The method of claim 1, wherein the at least one collapsed combination map includes a truth table.

14. A computer-implemented method of representing a mathematical transform between a binary output variable and a plurality of binary input variables on a computer display, the method comprising the steps of:

separating the plurality of binary input variables into a respective plurality of fields, each field of the plurality of fields corresponding to a respective display level of a multi-level display format having a top display level and at least one lower display level;

selecting a combination of the binary input variables of a first field of the plurality of fields, the first field corresponding to a first display level;

identifying combinations of the binary input variables of a second field of the plurality of fields which do not affect the value of the binary output variable for the selected combination of the binary input variables of the first field, the second field corresponding to a second display level lower than the first display level;

displaying, on the computer display at the second display level, the identified combinations of the binary input variables of the second field in at least one collapsed combination map.

15. The method of claim 14, wherein the identified combinations of the binary input variables of the second field comprise first identified combinations, and wherein the method further comprises a step of identifying second identified combinations of the binary input variables of the second field of the plurality of fields which affect the value of the binary output variable for the selected combination of the binary input variables of the first field.

16. The method of claim 15, wherein the method further comprises a step of displaying, on the computer display at the second display level, the binary input variables of the second identified combinations in at least one collapsed combination map.

17. The method of claim 16, wherein the step of displaying the binary input variables of the second identified combinations includes displaying the binary input variables of the second identified combinations in sequential order.

18. The method of claim 15, wherein the method further comprises a step of generating an array identifying the binary input variables of the second identified combinations.

19. The method of claim 18, wherein the method further comprises a step of arranging the identified binary input variables of the array in a sequence defining the order in which the identified binary input variables of the array are to be displayed in at least one collapsed combination map at the second display level.

20. The method of claim 19, wherein the method further comprises a step of displaying, on the computer display at the second display level, the identified binary input variables of the array in the arranged sequence in at least one collapsed combination map.

21. The method of claim 18, wherein prior to the step of generating an array, the method further comprises a step of marking the binary input variables of the second identified combinations as active.

22. The method of claim 18, wherein prior to the step of generating an array, the method further comprises a step of marking the binary input variables of the first identified combinations as inactive.

23. The method of claim 16, wherein the binary input variables of the first identified combinations are not present in the at least one collapsed combination map displaying the binary input variables of the second identified combinations.

24. The method of claim 15, wherein the method further comprises a step of displaying, on the computer display at the second display level, the second identified combinations of the binary input variables of the second field in at least one non-collapsed combination map.

25. The method of claim 14, wherein the method further comprises a step of displaying, on the computer display at the first display level, the selected combination of the binary input variables of the first field.

26. The method of claim 25, wherein the method further comprises a step of displaying an indication of a relationship between the selected combination of the binary input variables of the first field of the plurality of fields and a combination of the binary input variables of a second field of the plurality of fields.

27. A computer program having a plurality of instructions executable by a computer for implementing a method of representing a mathematical transform between a binary output variable and a plurality of binary input variables on a computer display, said computer program for directing the computer to perform the steps of:
  separating the plurality of binary input variables into a respective plurality of fields, each field of the plurality of fields corresponding to a respective display level of a multi-level display format having a top display level and at least one lower display level;
  selecting a combination of the binary input variables of a first field of the plurality of fields, the first field corresponding to a first display level;
  identifying combinations of the binary input variables of a second field of the plurality of fields which affect the binary output variable for the selected combination of the binary input variables of the first field of the plurality of fields, the second field corresponding to a second display level lower than the first display level;
  displaying, on the computer display at the second display level, the identified combinations of the binary input variables of the second field of the plurality of fields in at least one collapsed combination map.

28. The computer program of claim 27, wherein the at least one collapsed combination map includes no combinations of the binary input variables of the second field of the plurality of fields which do not affect the binary output variable for the selected combination of the binary input variables of the first field of the plurality of fields.

29. The computer program of claim 27, wherein the step of displaying includes a step of displaying the binary input variables of the identified combinations in a sequential order.

30. The computer program of claim 27, wherein prior to the step of displaying, said computer program further directs the computer to perform a step of defining a sequential order for the display of the binary input variables of the identified combinations.

31. The computer program of claim 30, wherein the step of defining includes a step of generating an array identifying the binary input variables of the identified combinations.

32. The computer program of claim 31, wherein the step of defining further includes a step of arranging the identified binary input variables of the array in the sequential order for display.

33. The computer program of claim 31, wherein the identified combinations are first identified combinations, wherein the step of identifying further includes identifying second identified combinations of the binary input variables of the second field of the plurality of fields which do not affect the binary output variable for the selected combination of the binary input variables of the first field of the plurality of fields, and wherein prior to the step of generating, the step of defining further includes a step of marking the binary input variables of the first identified combinations as active and the binary input variables of the second identified combinations as inactive.

34. The computer program of claim 33, wherein the step of generating an array includes generating an array identifying the binary input variables of the second identified combinations.

35. The computer program of claim 27, wherein the identified combinations comprise first identified combinations, wherein the step of identifying further includes identifying second identified combinations of the binary input variables of the second field of the plurality of fields which do not affect the binary output variable for the selected combination of the binary input variables of the first field of the plurality of fields, and wherein said computer program further directs the computer to perform a step of displaying, on the computer display at the second display level, the second identified combinations of the binary input variables of the second field of the plurality of fields in at least one collapsed combination map.

36. The computer program of claim 27, wherein said computer program further directs the computer to perform a step of displaying, on the computer display at the first display level, the selected combination of the binary input variables of the first field.

37. The computer program of claim 36, wherein said computer program further directs the computer to perform a step of displaying an indication of a relationship between the selected combination of the binary input variables of the first field of the plurality of fields and a combination of the binary input variables of a second field of the plurality of fields.

38. The computer program of claim 27, wherein the at least one collapsed combination map includes a Karnaugh map.

39. The computer program of claim 27, wherein the at least one collapsed combination map includes a truth table.

40. A computerized method of representing a mathematical transform between a binary output variable and a plurality of binary input variables on a computer display, the method comprising the steps of:

- separating the plurality of binary input variables into an ordered plurality of successive fields;
- generating a plurality of field combination maps for each respective successive field of the ordered plurality of successive fields, each field combination map having a plurality of cells;
- forming a plurality of field cell chains representative of all binary combinations of the plurality of binary input variables by associating field combination maps of successive fields of the ordered plurality of successive fields; and,
- displaying, in a collapsed form, the field combination maps of each field cell chain of the plurality of field cell chains which include binary input variables that do not affect the value of the binary output variable.

41. The method of claim 40, wherein each field cell chain of the plurality of field cell chains represents a unique combination of the plurality of binary input variables.

42. The method of claim 40, wherein the step of forming a plurality of field cell chains includes a step of assigning each cell of a field combination map of a successive field of the ordered plurality of successive fields to a unique field combination map of a subsequent successive field of the ordered plurality of successive fields.

43. The method of claim 42, wherein the successive field of each assigned cell immediately precedes the subsequent successive field in the ordered plurality of successive fields.

44. The method of claim 42, wherein the step of assigning includes the steps of assigning a unique identifier to each cell of a field combination map of a successive field of the ordered plurality of successive fields, and associating each unique identifier with a unique field combination map of a subsequent successive field of the ordered plurality of successive fields.

45. The method of claim 40, wherein each successive field of the ordered plurality of successive fields includes at least two binary input variables of the plurality of binary input variables, and wherein each cell of the plurality of cells of a field combination map of a successive field represents a unique binary combination of the binary input variables of said successive field.

46. The method of claim 40, wherein the method further comprises a step of displaying arrows extending between the associated field combination maps of successive fields of the ordered plurality of successive fields.

47. The method of claim 40, wherein at least one field combination map includes a Karnaugh map.

48. The method of claim 40, wherein at least one field combination map includes a truth table.

* * * * *